United States Patent
Song et al.

(10) Patent No.: US 10,581,645 B1
(45) Date of Patent: Mar. 3, 2020

(54) DUAL-RAIL TRANSCEIVER WITH IMPROVED SIGNAL-TO-NOISE RATIO FOR DIFFERENTIAL HIGH-SPEED LINKS

(71) Applicant: NVIDIA Corp., Santa Clara, CA (US)

(72) Inventors: Sanquan Song, Mountain View, CA (US); Nikola Nedovic, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/427,138

(22) Filed: May 30, 2019

(51) Int. Cl.
*H04L 25/03* (2006.01)
*H03K 19/0185* (2006.01)
*H04B 1/40* (2015.01)
*H03F 3/45* (2006.01)

(52) U.S. Cl.
CPC ... *H04L 25/03006* (2013.01); *H03F 3/45215* (2013.01); *H03K 19/018521* (2013.01); *H04B 1/40* (2013.01); *H03F 2203/45296* (2013.01); *H03F 2203/45352* (2013.01)

(58) Field of Classification Search
CPC ........... H04L 25/03006; H03F 3/45215; H03F 2203/45296; H03F 2203/45352; H03K 19/018521; H04B 1/40
See application file for complete search history.

(56) References Cited

U.S. PATENT DOCUMENTS

| | | | |
|---|---|---|---|
| 5,646,901 A | 7/1997 | Sharpe-Geisler et al. | |
| 5,796,295 A * | 8/1998 | Sharpe-Geisler | G11C 5/147 |
| | | | 327/541 |
| 7,058,121 B1 | 6/2006 | Kim et al. | |
| 2002/0024382 A1 | 2/2002 | Kwan et al. | |
| 2006/0033525 A1 | 2/2006 | Mair et al. | |
| 2006/0202721 A1 | 9/2006 | Partow et al. | |
| 2008/0068083 A1 | 3/2008 | Singh et al. | |
| 2008/0116936 A1 | 5/2008 | Huang et al. | |
| 2010/0026342 A1 | 2/2010 | Parameswaran et al. | |
| 2014/0156893 A1 * | 6/2014 | Monroe | G06F 13/372 |
| | | | 710/117 |
| 2015/0180473 A1 | 6/2015 | Amadi | |

* cited by examiner

*Primary Examiner* — Jaison Joseph
(74) *Attorney, Agent, or Firm* — Rowan TELS LLC

(57) ABSTRACT

A signal transceiver includes a signal transmitter driving a first differential link between a supply voltage of the signal transmitter and a fraction of the supply voltage, and driving a second differential link between the faction of the supply voltage and a reference ground. The signal transceiver also includes a signal receiver in which the first differential link is coupled to a gate node of an NMOS transistor and to a source node of a PMOS transistor; and the second differential link is coupled to a source node of the NMOS transistor and to a gate node of the PMOS transistor.

20 Claims, 22 Drawing Sheets

DUAL-RAIL TRANSCEIVER WITH IMPROVED SIGNAL-TO-NOISE RATIO FOR DIFFERENTIAL HIGH-SPEED LINKS

BACKGROUND

In modern deep learning applications the data exchange among different integrated circuits may occur at rates up to tens of giga bit per second per data lane with an energy consumption in the range of pico-joules per bit. The channel loss at such a high frequency introduces inter-symbol interference (ISI) which limits the communication speed and requires more power for compensation. In this context, "inter-symbol interference" refers to a form of distortion of a signal in which one communicated symbol interferes with others.

To mitigate these effects various equalization schemes may be utilized such as signal transmitter pre-emphasis, multi-stage signal receiver continuous-time linear equalization (CTLE) and multi-tap signal receiver decision feedback equalization (DFE), resulting in design complexity and high power consumption.

A need therefore exists for a low power and low complexity signal transceiver design with significant equalization ability, larger peaking gain, higher peaking frequency, and less signal receiver noise than conventional approaches. The amplifier gain plot 100 of FIG. 1 depicts an example of peaking gain and peaking frequency.

BRIEF SUMMARY

A dual-rail signal transceiver front-end for differential high-speed links reduces inter-symbol-interference (ISI) with improved signal-to-noise ratio (signal-to-noise-ratio). In this context, "dual-rail" refers to signaling device in which data is conveyed using a differential voltage, with a fixed common mode offset between the two signal conductors. In other words, the common mode itself is not fixed on dual-rail paths, but the common mode offset is fixed between the rails. By contrast, a differential pair refers to differential signaling with a fixed common mode. At a transmitter (signal transmitter) end three switches are utilized to (1) drive a first link of the differential channel (the high-signal differential link) between $V_{DD}$ (supply voltage) and $V_{DD}/2$ (or some other faction of the supply voltage) and (2) to drive a second link (the low-signal differential link) between $V_{DD}/2$ (or some other faction of the supply voltage) and reference ground (GND). In this context, "low-signal differential link" refers to the differential link of a differential pair having a lower common mode voltage than the other. In this context, "common mode voltage" refers to signal attributes common to both differential links of a differential pair. In this context, "high-signal differential link" refers to the differential link with a higher common mode voltage than the other differential link in a differential pair. The signal receiver comprises (1) an NMOS transistor gate-coupled to the high-signal differential link and source-coupled to the low-signal differential link, and (2) a PMOS transistor source-coupled to the high-signal differential link and gate-coupled to the low-signal differential link. In this context, "differential link" refers to one wire of a differential pair. Thus the full differential signal is applied to both the signal transmitter and signal receiver devices providing an advantageous (e.g., 6 dB) gain compared with a conventional differential pair signal receiver front-end. Furthermore the signal receiver device noise is degenerated advantageously (e.g., by up to 6 dB) yielding a total (e.g., 12 dB) signal-to-noise-ratio improvement over conventional approaches. The signal receiver output may be level-shifted by an inverter, with further peaking then applied, or an alternating current-coupled circuit may be utilized before slicing is applied by a conventional sense amplifier (sense amplifier). In this context, "sense amplifier" refers to a circuit configured to sense small voltage differences from a differential pair and amplify the small difference to logic levels recognizable by subsequent circuitry. Alternatively a dual-rail sense amplifier may be utilized to slice the signal receiver output directly.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
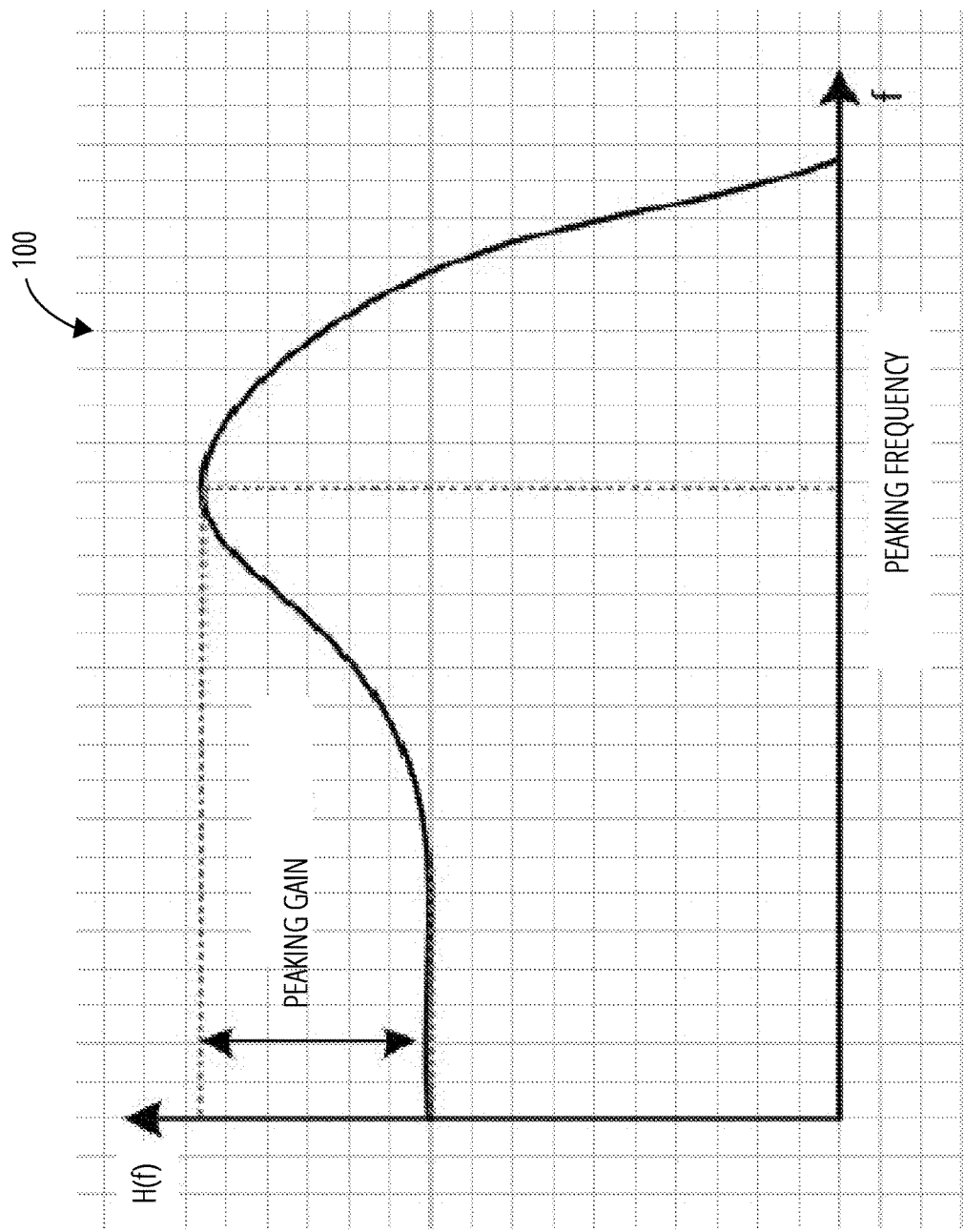
FIG. 1 illustrates an amplifier gain plot 100 in accordance with one embodiment.
Figure 2:
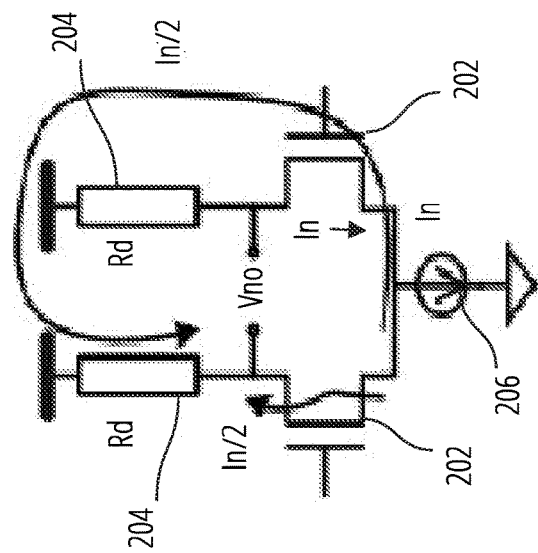
FIG. 2 illustrates a conventional differential link 200 in accordance with one embodiment.

A conventional NMOS based differential pair exhibits a noise current $i_n$ flowing from drain node to source node. As the source node voltage increases a resulting current of magnitude $i_n/2$ flows from the source node to the drain node with another current of magnitude $i_n/2$ current flowing though the drain node resistive element $r_d$. This noise current generates a noise voltage of magnitude $i_n r_d$ in the output voltage $V_{no}$. The resulting signal-to-noise-ratio from both NMOS devices at the circuit output is given by $$\frac{(g_m r_d V_{in})^2}{2(i_n r_d)^2} \qquad \text{Equation 1}$$

where $g_m$ is the transconductance of the NMOS devices. FIG. 2 illustrates a conventional differential link 200 including NMOS transistors 202 and drain node resistive elements 204.

A source node degeneration design may be utilized with a resistive element valued at $2R_s$ (where Rs represents the source node resistance) with a signal gain from input voltage $V_{in}$ to output voltage $V_{no}$ given by $$\frac{g_m r_d V_{in}}{1 + g_m r_s} \qquad \text{Equation 2}$$

The output voltage is given by $g_m r_d V_{in}$ and the output voltage noise component is given by $$\frac{i_n r_d}{1 + g_m r_s} \qquad \text{Equation 3}$$

Hence, the resulting signal-to-noise ratio from both NMOS devices at the circuit output is the same as given by Equation 1.

Figure 3:
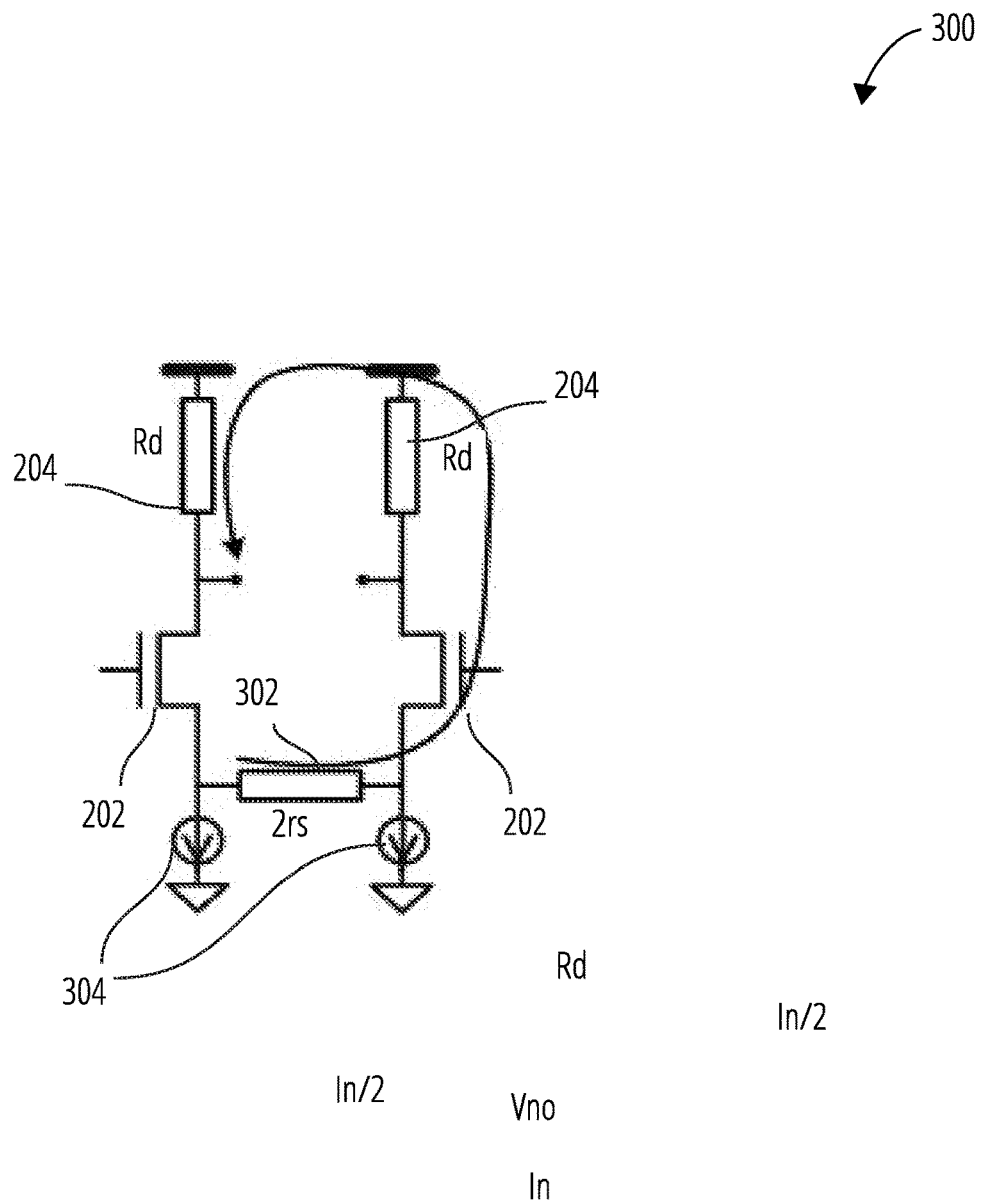
FIG. 3 illustrates a conventional differential link with source degeneration 300 in accordance with one embodiment.

FIG. 3 illustrates a conventional differential link with source degeneration 300 utilizing a degenerative resistive element 302 at the source nodes of the NMOS transistors 202. Each of the ideal current sources 304 is modelled with ½ of the current of the ideal current source 206 of the conventional differential link 200 in FIG. 2. Upon further analysis the resulting signal-to-noise ratio from both NMOS devices at the circuit output is shown to be the same as given in Equation 1.

Figure 4:
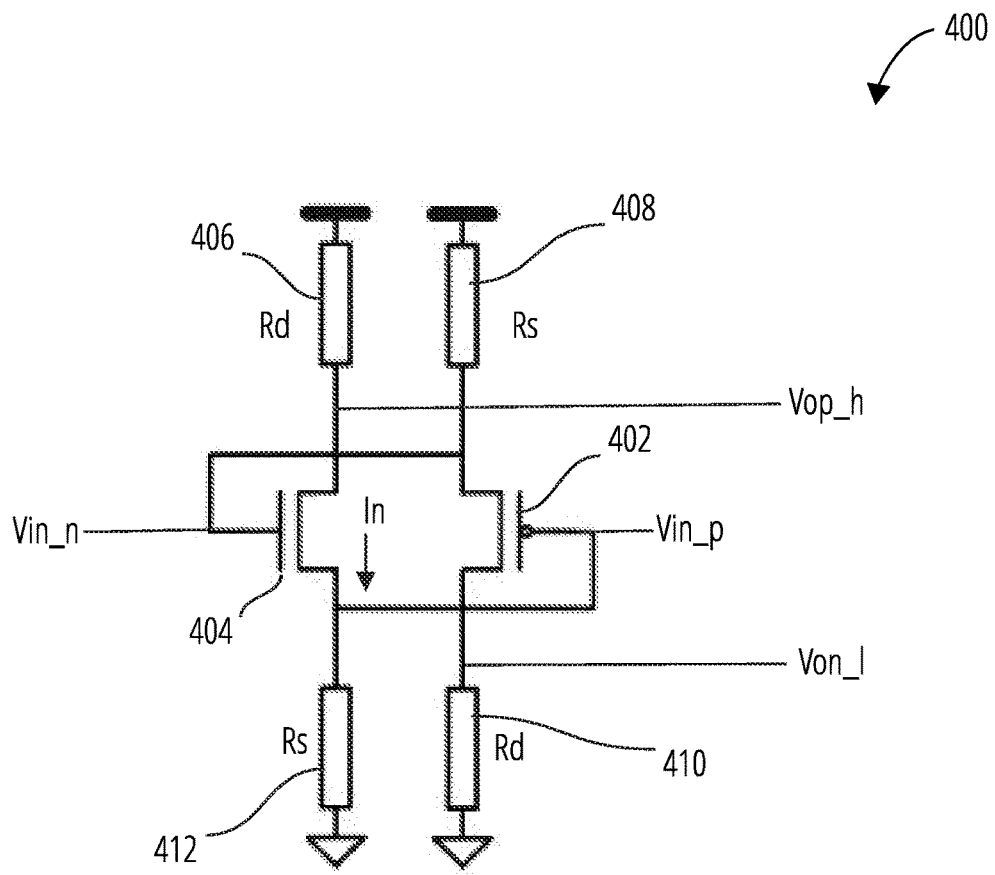
FIG. 4 illustrates a dual-rail signal receiver front-end 400 in accordance with one embodiment.

FIG. 4 illustrates a dual-rail signal receiver front-end 400 in one embodiment, comprising a PMOS transistor 402, an NMOS transistor 404, an NMOS transistor drain node resistive element 406, a PMOS transistor source node resistive element 408, a PMOS transistor drain node resistive element 410, and an NMOS transistor source node resistive element 412.

The improved signal receiver front end of FIG. 4 utilizes a dual-rail design, with a high-signal differential link coupled to the gate node of an NMOS transistor and the source node of a PMOS transistor while the low-signal differential link is coupled to the gate node of the PMOS transistor and the source node of the NMOS transistor. The differential output voltage for such a design is given by $2g_m r_d V_{in}$ which is twice that of conventional differential pair. The differential voltage output noise component is given by $$\frac{i_n r_d}{1 + 2g_m r_s} \qquad \text{Equation 4}$$

Assuming $2g_m r_s = 1$, the noise at the receiver is reduced by half. This may yield a 12 dB signal-to-noise-ratio improvement over conventional approaches.

Figure 5:
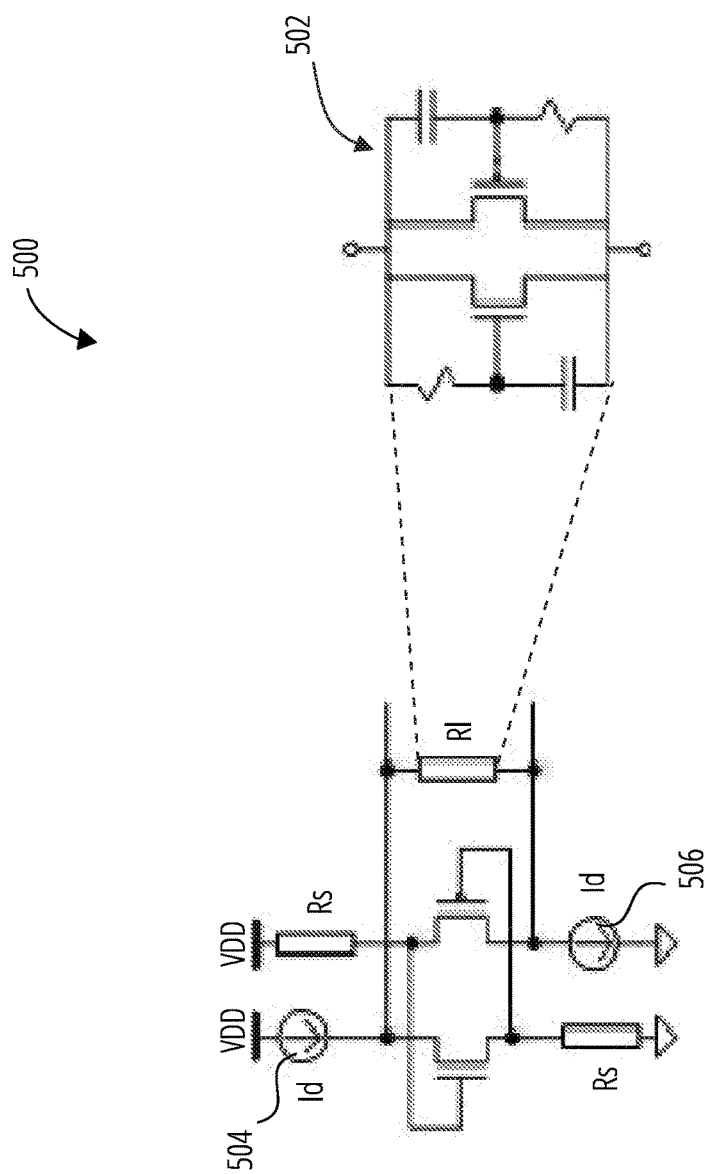
FIG. 5 illustrates a dual-rail signal receiver front-end 500 in accordance with one embodiment.

In implementations where the power supply ($V_{DD}$) noise is dominant, a dual-rail signal receiver front-end 500 embodiment such as shown in FIG. 5 may be utilized. The input-to-output characteristics of the dual-rail signal receiver front-end 500 are substantially identical to those of the dual-rail signal receiver front-end 400. However the NMOS transistor drain node resistive element 406 is replaced with constant current source 504 and the PMOS transistor drain node resistive element 410 is replaced with constant current source 506. If the output impedance of each of the current sources $I_d$ is much larger than $r_d$, the power supply or ground small signal (noise) is approximately equally distributed to the two output differential links. Therefore, the single-ended supply noise is converted to a differential noise at the amplifier output, and if a subsequent (next stage) circuit has high common mode rejection (which is well known and relatively easy to accomplish), the supply noise will be rejected. A further improvement can be made by implementing the impedance $r_1$ as an explicit or symmetric active inductive circuit 502.

Figure 6:
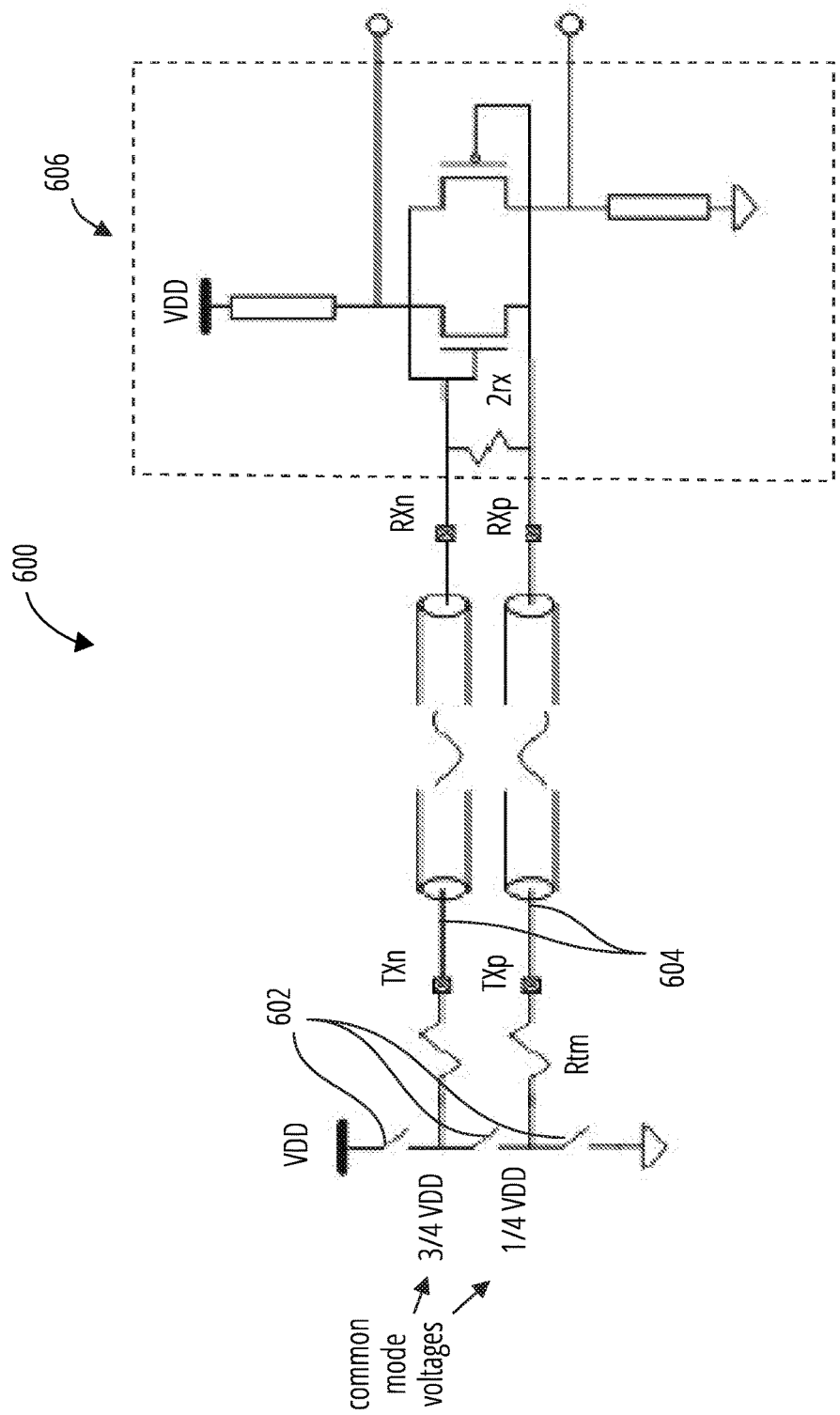
FIG. 6 illustrates a dual-rail signal transceiver 600 in accordance with one embodiment.

To support the high signal-to-noise-ratio pair of the signal receiver front end, a signal transmitter may be utilized to drive differential links with two different common mode voltages, for example of ¾$V_{DD}$ on one link (N) and ¼$V_{DD}$ on the other link (P). In one implementation for bit '0' $TX_N$ is pulled up to $V_{DD}$ and $TX_P$ is pulled down to GND and for bit '1' $TX_N$ and $TX_P$ are pulled together. A signal receiver terminator resistive element $2R_{RX}$ may be utilized in some embodiments to provide impedance matching between the differential links 604 at the receiver. This resistive element can be omitted for example if ½$g_m$ equals 50. A signal transmitter terminator resistive element $R_{TM}$ may represent the source node resistive element $r_s$. FIG. 6 illustrates an embodiment of a dual-rail signal transceiver 600 in accordance with these design features, including transmitter switches 602, differential links 604, and a low-noise signal receiver 606 (depicted with a topology comprising a very high source resistance $r_s$, e.g., $r_s$=infinite).

More generally, at the signal transmitter end one of the differential links is switched at higher voltage levels than the other differential link to generate a bit. In one embodiment, the high-signal differential link is switched between ½$V_{DD}$ and $V_{DD}$ to generate a bit, while the low-signal differential link is switched between ½$V_{DD}$ and reference ground to generate a bit. At the signal receiver end the high-signal differential link is coupled to the gate node of an NMOS transistor and to the source node of a PMOS transistor, while the low-signal differential link is coupled to the source node of the NMOS transistor and the gate node of the PMOS transistor. Consequently, direct current flows from the signal transmitter power supply through the high-signal differential link to the signal receiver PMOS transistor and to the signal receiver reference ground. Direct current also flows from the signal receiver power supply through the signal receiver NMOS transistor and to the signal transmitter reference ground.

Figure 7:
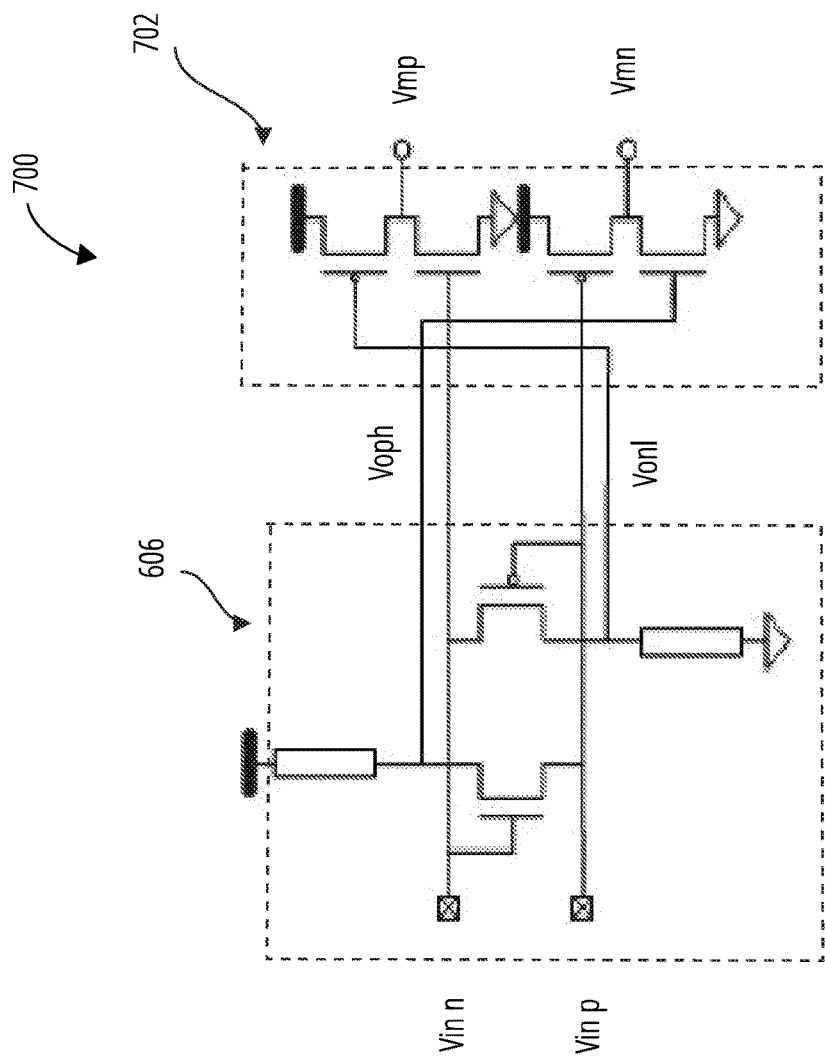
FIG. 7 illustrates a signal receiver with voltage level-shifting circuit 700 in accordance with one embodiment.
Figure 8:
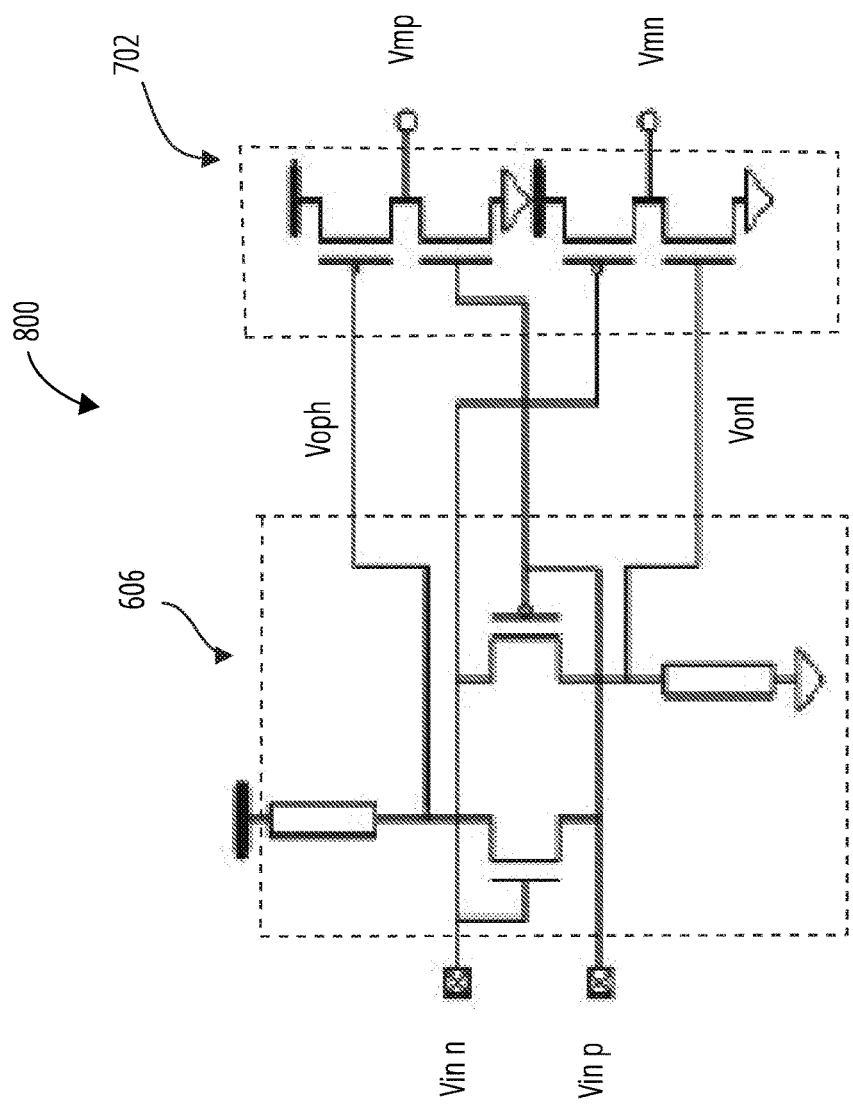
FIG. 8 illustrates a signal receiver with voltage level-shifting circuit 800 in accordance with another embodiment.

To generate the received bit, a voltage level-shifting circuit or a sense amplifier may be utilized in a following stage. In this context, "voltage level-shifting circuit" refers to a circuit to change the voltage level of a signal. In some embodiments an inverter with split inputs may be utilized as the voltage level-shifting circuit. In one embodiment the high input rail $V_{in\_n}$ and high output rail $V_{OPH}$ control NMOS transistors of the signal receiver and the low input rail $V_{in\_p}$ and low output rail $V_{ONL}$ control PMOS transistors of the signal receiver. This provides higher gain and wider bandwidth at the cost of higher power consumption. FIG. 7 illustrates a signal receiver with voltage level-shifting circuit 700 embodiment in accordance with this approach, including the low-noise signal receiver 606 and voltage level-shifting circuit 702. Alternatively, the high rails may be applied to control the PMOS transistors and the low rails applied to the NMOS transistors consuming less current with comparatively less signal gain and bandwidth. This latter alternative pulls the common mode (CM) output voltage levels $V_{mp}$ and $V_{mn}$ close to one another and additional mechanisms may be utilized to make them substantially identical. FIG. 8 illustrates a signal receiver with voltage level-shifting circuit 800 embodiment in accordance with this latter approach, including the low-noise signal receiver 606 and voltage level-shifting circuit 702.

Figure 9:
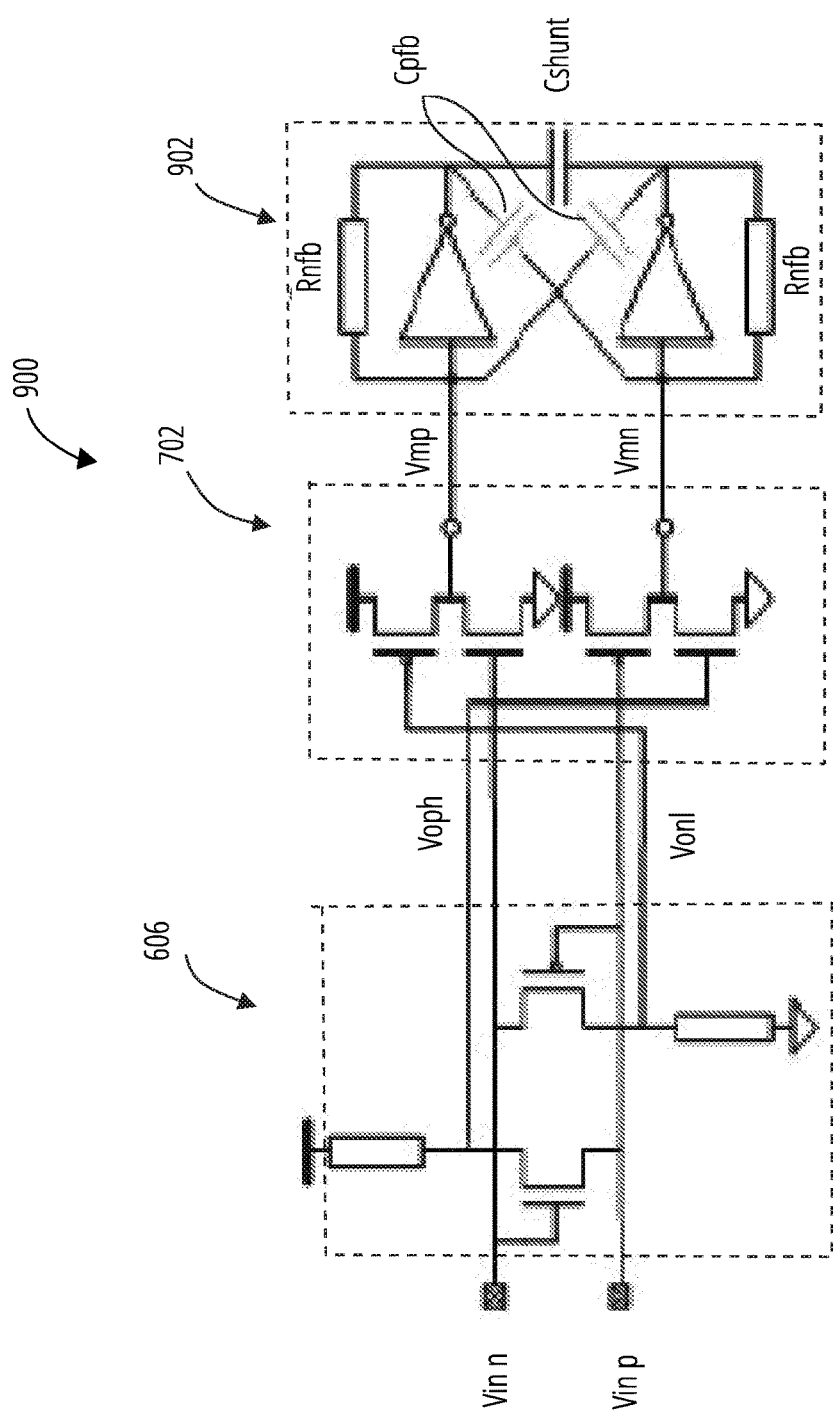
FIG. 9 illustrates a signal receiver with voltage level-shifting circuit and peaking circuit 900 in accordance with one embodiment.

To introduce peaking an inverter with feedback resistive element $R_{NFB}$, shunt capacitive element $C_{SHUNT}$ and positive feedback capacitive element $C_{PFB}$ may be utilized. Peaking refers to an amplitude/gain boost (widening of the signal eye) of the recovered bit in the desired operational frequency range of the signal transceiver. The inverter input is coupled to the output nodes $V_{mp}$ and $V_{mn}$ of the voltage level-shifting circuit. The inverters are cross-coupled and each comprising resistive and capacitive feedback elements. At direct current, there is no current through $R_{NFB}$ assuming a direct current operation point of $V_{DD}/2$ for the inverter input and output and the input impedance of the inverter is $1/(g_{mp}+g_{mn})$, where $g_{mp}$ and $g_{mn}$ are the transconductance of the PMOS transistor and NMOS transistor, respectively, utilized in each inverter. At alternating current, the inverter output is shunted to GND and the input impedance becomes $R_{NFB}$. Therefore, a peaking gain of $(g_{mp}+g_{mn})R_{NFB}$ is achieved. The positive feedback capacitive element $C_{PFB}$ improves the peaking gain further with lower peaking frequency. FIG. 9 illustrates a signal receiver with voltage level-shifting circuit and peaking circuit 900 in one embodiment including the low-noise signal receiver 606, voltage level-shifting circuit 702, and peaking circuit 902.

Figure 10:
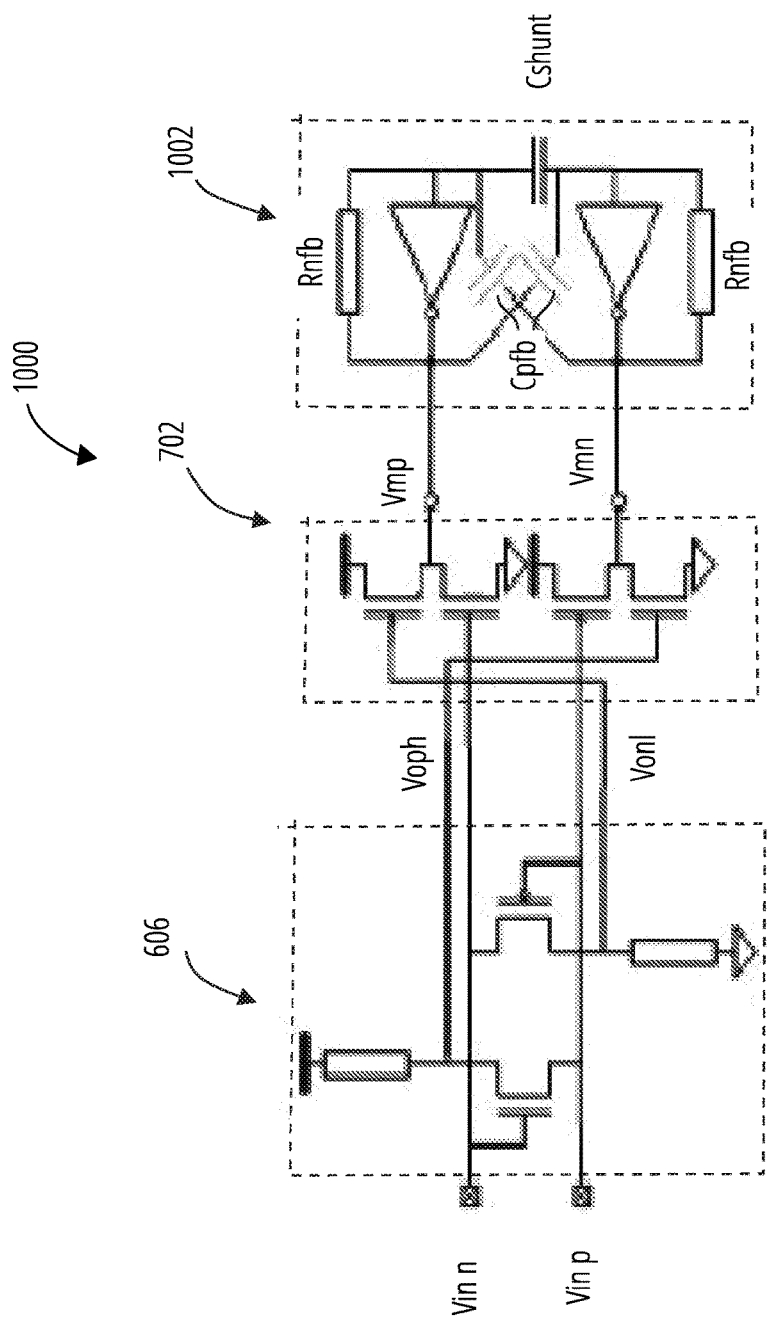
FIG. 10 illustrates a signal receiver with voltage level-shifting circuit and peaking circuit 1000 in accordance with another embodiment.

An alternative embodiment of a peaking circuit 1002 may be utilized to generate the same direct current and alternating current gain as the peaking circuit 902 (see the signal receiver with voltage level-shifting circuit and peaking circuit 1000 of FIG. 10). However, this embodiment leads to more noise because the noise current from the peaking circuit 1002 injects to the output nodes $V_{mp}$ and $V_{mn}$ directly.

Figure 11:
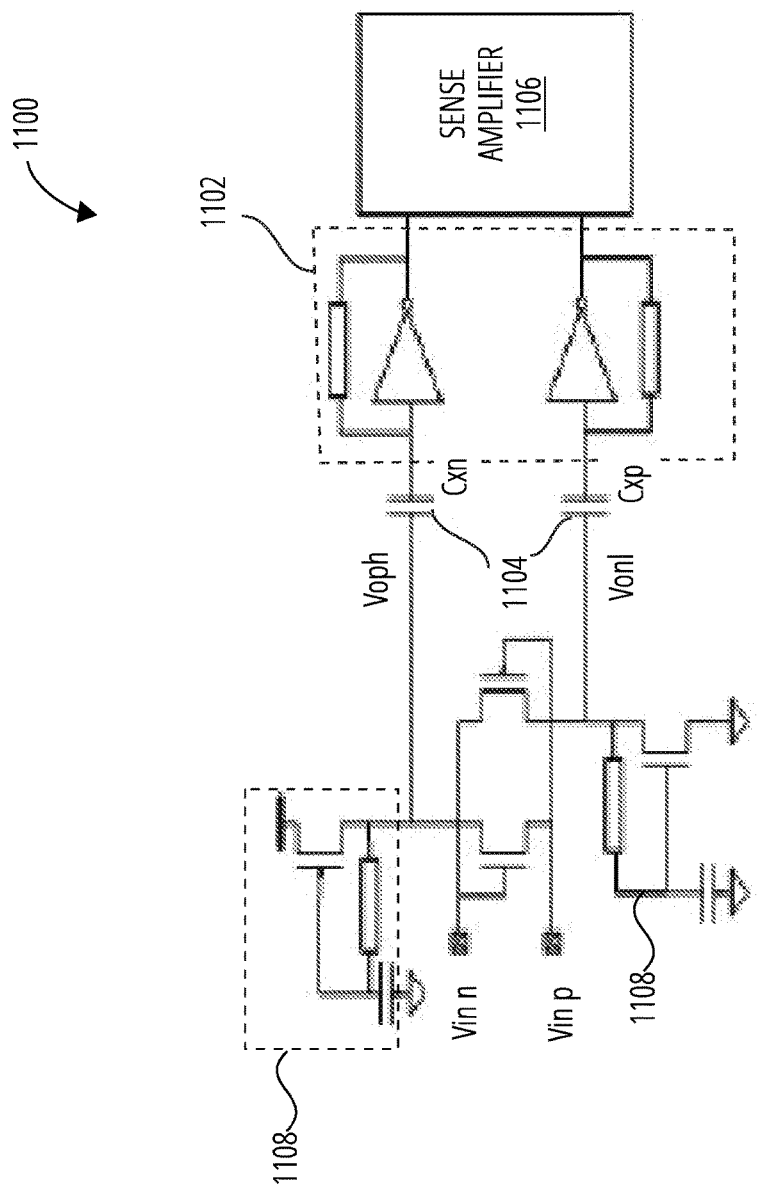
FIG. 11 illustrates an AC-coupled voltage level-shifting circuit 1100 in accordance with one embodiment.

An AC-coupled voltage level-shifting circuit may be utilized as an output filter to rebuild the direct current by way of an inverter with resistive feedback. A coupling capacitive element may be utilized with a capacitance that is selected to enable sequences of 0s and 1s of the length required by the implementation. The original low frequency signal is filtered out and the new low frequency signal is rebuilt which introduces additional noise and reduces the signal-to-noise-ratio. An embodiment of an AC-coupled voltage level-shifting circuit 1100 in accordance with these features is shown in FIG. 11, including the inverters with resistive element feedback 1102, coupling capacitive elements 1104, and a sense amplifier 1106. Both differential links may utilize active inductors, such as the active inductive circuit 1108 embodiment depicted.

Figure 12:
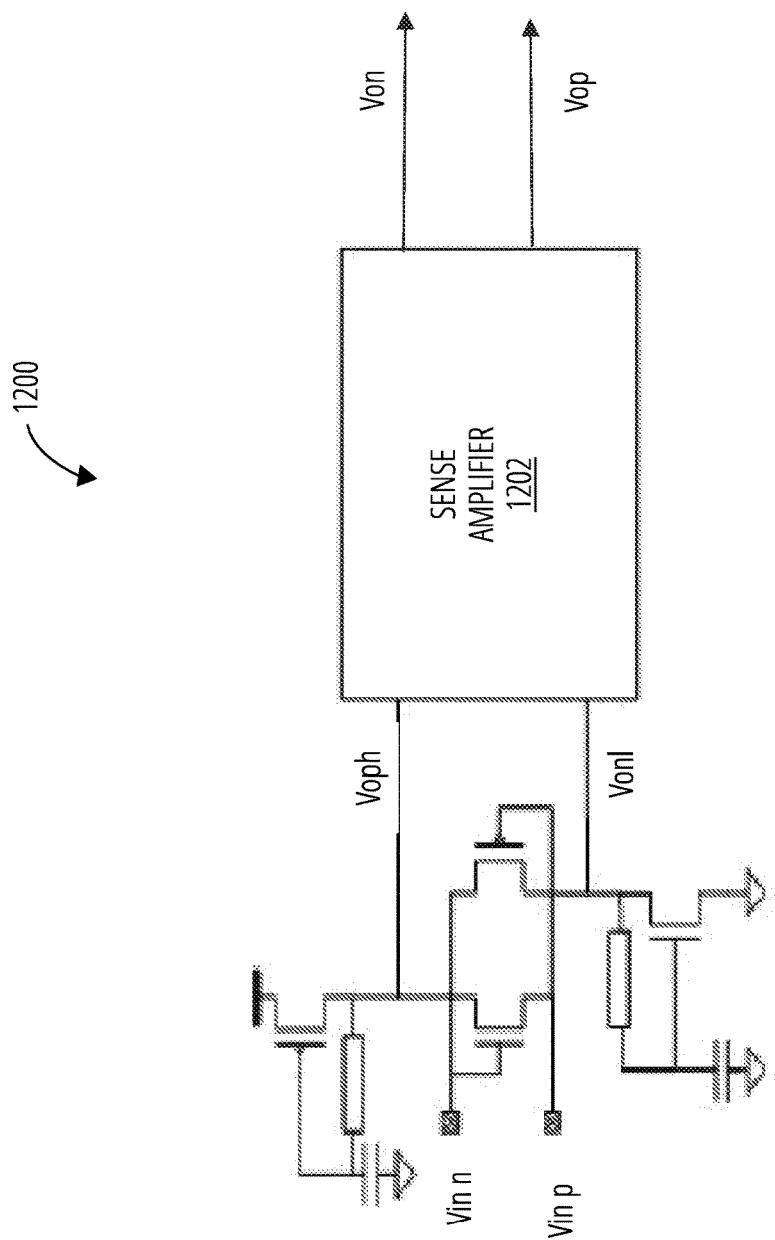
FIG. 12 illustrates a signal receiver with dual-rail sense amplifier 1200 in accordance with one embodiment.
Figure 13:
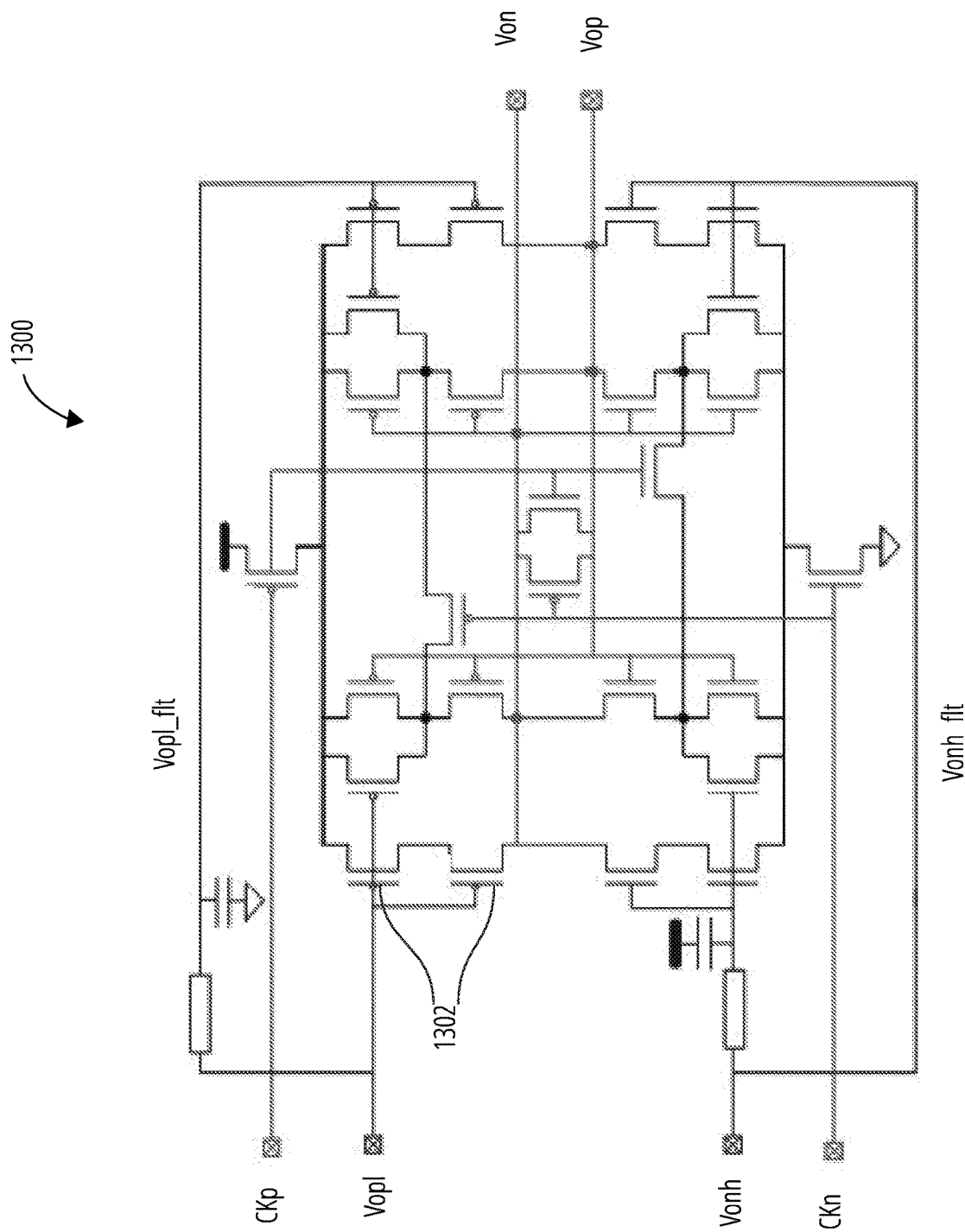
FIG. 13 illustrates a detailed dual-rail sense amplifier 1300 in accordance with one embodiment.

In one embodiment a differential sense amplifier is utilized and operates in both a preset mode and an evaluation mode as driven by a clock signal. In the preset mode the outputs $V_{ON}$ and $V_{OP}$ are each set to $\frac{1}{2}V_{DD}$. In the evaluation mode the high-signal differential link input $V_{OPL}$ is compared with its low passed version $V_{OPL\_FLT}$ and the high-signal differential link input $V_{OPH}$ is compared with its low passed version $V_{OPH\_FLT}$. For example if $V_{OPL} > V_{OPL\_FLT}$ and $V_{ONL} < V_{ONL\_FLT}$ then $V_{OP}$ and $V_{ON}$ settle to $V_{DD}$ and GND respectively. Current bleeding circuits may be utilized to further reduce the input referred noise. In this context, "current bleeding circuit" refers to a circuit to drain current out of another circuit. An embodiment of a signal receiver with dual-rail sense amplifier 1200 utilizing such a sense amplifier 1202 is illustrated in FIG. 12. A dual-rail sense amplifier 1300 in one embodiment is illustrated in more detail in FIG. 13, including current bleeding circuits 1302 that may be utilized.

Figure 14:
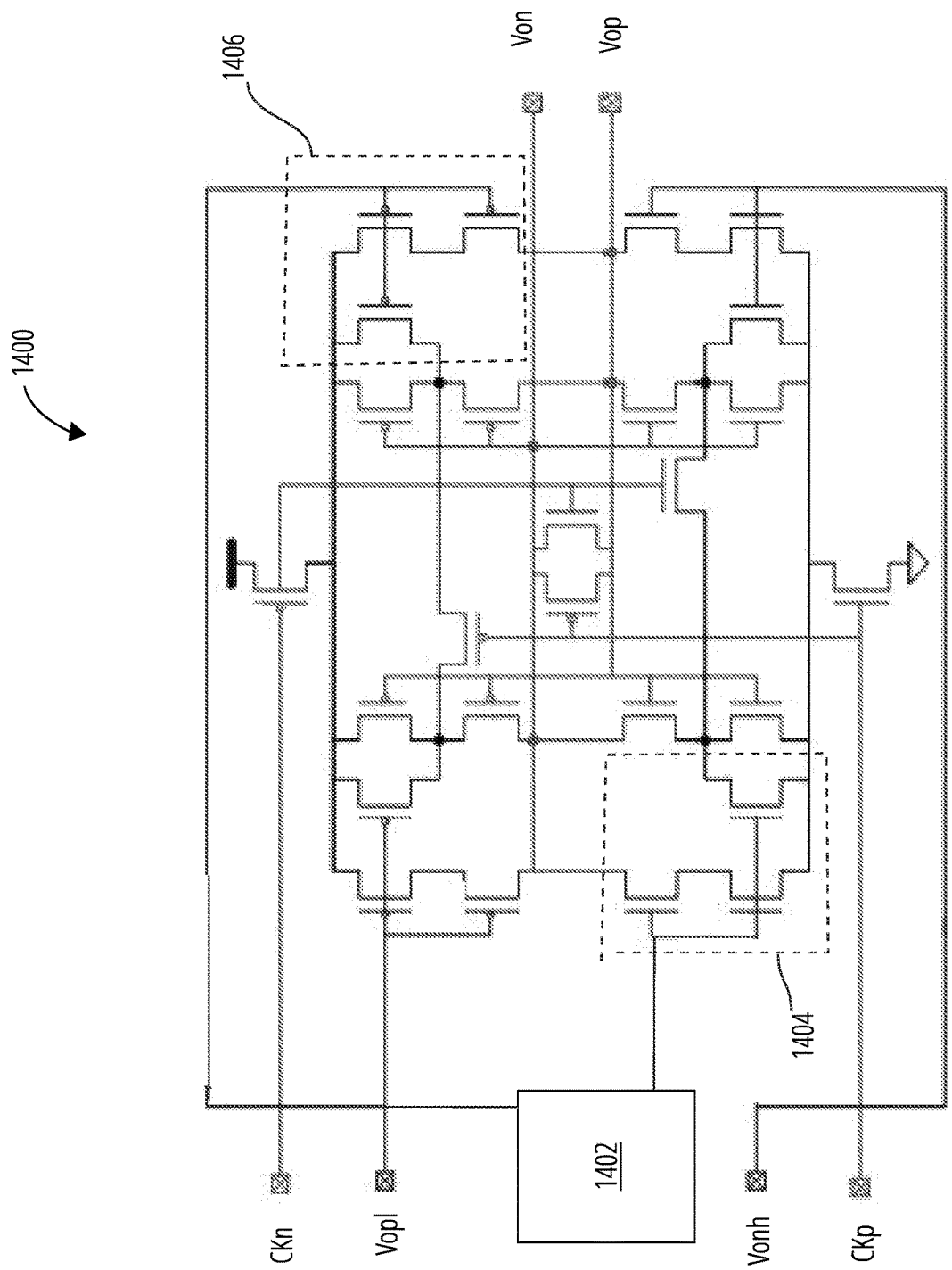
FIG. 14 illustrates a dual-rail sense amplifier 1400 with calibration in accordance with one embodiment.

The differential sense amplifier may also be implemented by reusing an offset compensation loop, a common circuit found in modern serial links. In this approach the sense amplifier is modified to enable controllable reference voltages to pull-down and pull-up differential pairs and a loop is closed during calibration to converge to a calibration goal, for example to receive equal number of logical zeroes and ones, just as is done in a typical calibration scheme. In addition to this conventional algorithm, the calibration algorithm also generates complementary pull-down and pull-up calibration codes or analog voltages. The calibration codes or voltages act as the averages of the input voltages with any added offset generated from the sense amplifier. An embodiment of a dual-rail sense amplifier 1400 utilizing these design features is illustrated in FIG. 14, including the calibration logic 1402, digital-to-analog converter 1404 for $V_{ON}$, and digital-to-analog converter 1406 for $V_{OP}$.

By way of example, during calibration the inputs of the dual-rail sense amplifier 1400 may be connected to 3VDD/4 and VDD/4 respectively and sweep the calibration configuration so that $V_{ON}/V_{OP}$ is 1 for 50% of the inputs and 0 for 50% of the inputs.

Figure 15:
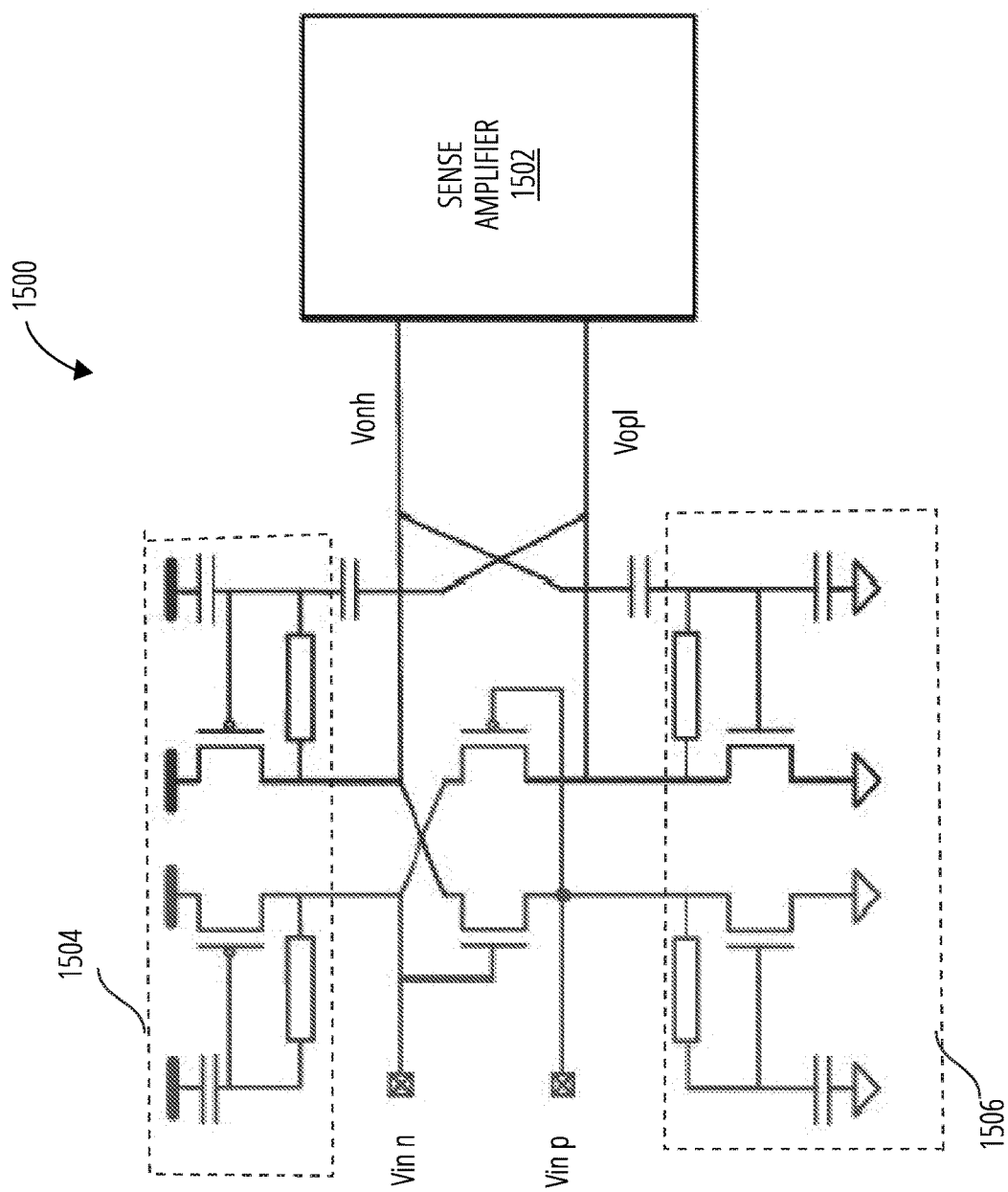
FIG. 15 illustrates a signal receiver with active inductive circuits 1500 in accordance with one embodiment.

A PMOS transistor-based active inductive circuit may be utilized to pull $V_{in\_n}$ high and an NMOS transistor-based active inductive circuit may be utilized to pull $V_{in\_p}$ low, so that the input NMOS transistor and PMOS transistor are always ON. In this context, "active inductive circuit" refers to an inductive circuit implemented using transistors and capacitors to achieve an inductive impedance. This causes the input impedance of the signal receiver to remain relatively constant across a wide range of input voltages. Yet another active inductive circuit may be utilized for the signal receiver load to provide peaking (see FIG. 5). Capacitors may be deployed around the PMOS based active inductive circuit and are referenced to $V_{DD}$ to decrease the influence of supply noise. FIG. 15 illustrates an embodiment of a signal receiver with active inductive circuits 1500 in accordance with these design features, including a sense amplifier 1502, PMOS transistor-based active inductive circuit 1504, and NMOS transistor-based active inductive circuit 1506.

The following description may use certain acronyms and abbreviations when describing the disclosed embodiments used in conjunction with systems utilizing graphic processing units, as follows:

"DPC" refers to a "Data Processing Clusters";
"GPC" refers to a "general processing cluster";

'I/O' refers to a "input/output";
"L1 cache" refers to "level one cache";
"L2 cache" refers to "level two cache";
"LSU" refers to a "load/store unit";
"MMU" refers to a "memory management unit";
"MPC" refers to an "M-pipe controller";
"PPU" refers to a "parallel processing unit";
"PROP" refers to a "pre-raster operations unit";
"ROP" refers to a "Raster Operations";
"SFU" refers to a "special function unit";
"SM" refers to a "streaming multiprocessor";
"Viewport SCC" refers to "viewport scale, cull, and clip";
"WDX" refers to a "work distribution crossbar"; and
"XBar" refers to a "crossbar".

Parallel Processing Unit

Embodiments of the disclosed circuits may be utilized for communication between graphics processing units, or graphics processing units and general purpose or special purpose processors, or any of the preceding and a data communication network (a crossbar 1618, an NVLink 1608, etc.) From the following drawings and description it will be readily apparent where embodiments of the invention may be utilized.

Figure 16:
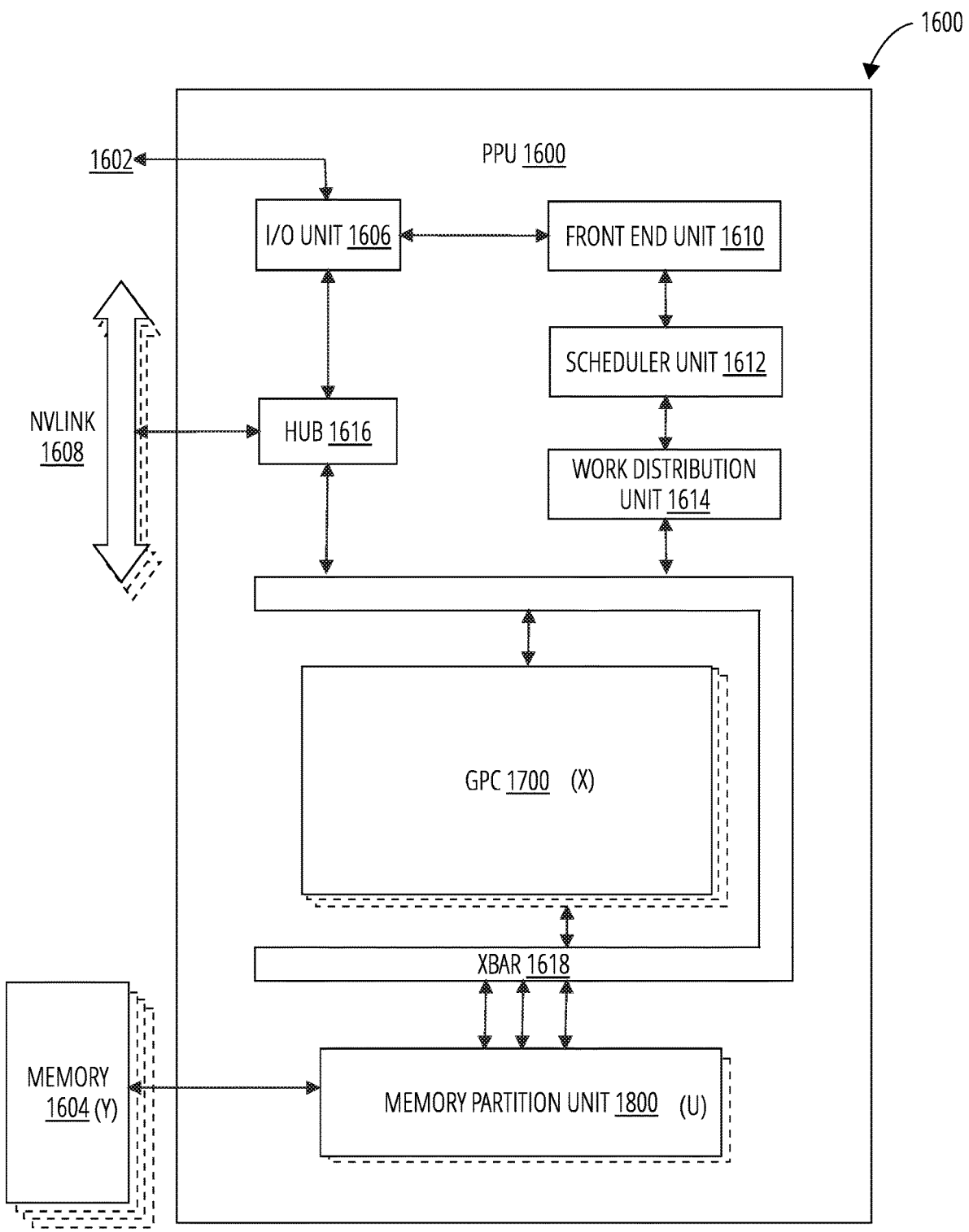
FIG. 16 illustrates a parallel processing unit 1600 in accordance with one embodiment.

FIG. 16 illustrates a parallel processing unit 1600, in accordance with an embodiment. In an embodiment, the parallel processing unit 1600 is a multi-threaded processor that is implemented on one or more integrated circuit devices. The parallel processing unit 1600 is a latency hiding architecture designed to process many threads in parallel. A thread (e.g., a thread of execution) is an instantiation of a set of instructions configured to be executed by the parallel processing unit 1600. In an embodiment, the parallel processing unit 1600 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 1600 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 1600 modules may be configured to accelerate thousands of High Performance Computing (HPC), data center, and machine learning applications. The parallel processing unit 1600 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 16, the parallel processing unit 1600 includes an I/O unit 1606, a front end unit 1610, a scheduler unit 1612, a work distribution unit 1614, a hub 1616, a crossbar 1618, one or more GPC 1700 modules, and one or more memory partition unit 1800 modules. The parallel processing unit 1600 may be connected to a host processor or other parallel processing unit 1600 modules via one or more high-speed NVLink 1608 interconnects. The parallel processing unit 1600 may be connected to a host processor or other peripheral devices via an interconnect 1602. The parallel processing unit 1600 may also be connected to a local memory comprising a number of memory 1604 devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 1608 interconnect enables systems to scale and include one or more parallel processing unit 1600 modules combined with one or more CPUs, supports cache coherence between the parallel processing unit 1600 modules and CPUs, and CPU mastering. Data and/or commands may be transmitted by the NVLink 1608 through the hub 1616 to/from other units of the parallel processing unit 1600 such as one or more copy engines, a video encoder, a video decoder, a power management unit, etc. (not explicitly shown). The NVLink 1608 is described in more detail in conjunction with FIG. 20.

The I/O unit 1606 is configured to transmit and receive communications (e.g., commands, data, etc.) from a host processor (not shown) over the interconnect 1602. The I/O unit 1606 may communicate with the host processor directly via the interconnect 1602 or through one or more intermediate devices such as a memory bridge. In an embodiment, the I/O unit 1606 may communicate with one or more other processors, such as one or more parallel processing unit 1600 modules via the interconnect 1602. In an embodiment, the I/O unit 1606 implements a Peripheral Component Interconnect Express (PCIe) interface for communications over a PCIe bus and the interconnect 1602 is a PCIe bus. In alternative embodiments, the I/O unit 1606 may implement other types of well-known interfaces for communicating with external devices.

The I/O unit 1606 decodes packets received via the interconnect 1602. In an embodiment, the packets represent commands configured to cause the parallel processing unit 1600 to perform various operations. The I/O unit 1606 transmits the decoded commands to various other units of the parallel processing unit 1600 as the commands may specify. For example, some commands may be transmitted to the front end unit 1610. Other commands may be transmitted to the hub 1616 or other units of the parallel processing unit 1600 such as one or more copy engines, a video encoder, a video decoder, a power management unit, etc. (not explicitly shown). In other words, the I/O unit 1606 is configured to route communications between and among the various logical units of the parallel processing unit 1600.

In an embodiment, a program executed by the host processor encodes a command stream in a buffer that provides workloads to the parallel processing unit 1600 for processing. A workload may comprise several instructions and data to be processed by those instructions. The buffer is a region in a memory that is accessible (e.g., read/write) by both the host processor and the parallel processing unit 1600. For example, the I/O unit 1606 may be configured to access the buffer in a system memory connected to the interconnect 1602 via memory requests transmitted over the interconnect 1602. In an embodiment, the host processor writes the command stream to the buffer and then transmits a pointer to the start of the command stream to the parallel processing unit 1600. The front end unit 1610 receives pointers to one or more command streams. The front end unit 1610 manages the one or more streams, reading commands from the streams and forwarding commands to the various units of the parallel processing unit 1600.

The front end unit 1610 is coupled to a scheduler unit 1612 that configures the various GPC 1700 modules to process tasks defined by the one or more streams. The scheduler unit 1612 is configured to track state information related to the various tasks managed by the scheduler unit 1612. The state may indicate which GPC 1700 a task is assigned to, whether the task is active or inactive, a priority level associated with the task, and so forth. The scheduler unit 1612 manages the execution of a plurality of tasks on the one or more GPC 1700 modules.

The scheduler unit 1612 is coupled to a work distribution unit 1614 that is configured to dispatch tasks for execution on the GPC 1700 modules. The work distribution unit 1614 may track a number of scheduled tasks received from the scheduler unit 1612. In an embodiment, the work distribution unit 1614 manages a pending task pool and an active task pool for each of the GPC 1700 modules. The pending task pool may comprise a number of slots (e.g., 32 slots) that contain tasks assigned to be processed by a particular GPC 1700. The active task pool may comprise a number of slots (e.g., 4 slots) for tasks that are actively being processed by the GPC 1700 modules. As a GPC 1700 finishes the execution of a task, that task is evicted from the active task pool for the GPC 1700 and one of the other tasks from the pending task pool is selected and scheduled for execution on the GPC 1700. If an active task has been idle on the GPC 1700, such as while waiting for a data dependency to be resolved, then the active task may be evicted from the GPC 1700 and returned to the pending task pool while another task in the pending task pool is selected and scheduled for execution on the GPC 1700.

The work distribution unit 1614 communicates with the one or more GPC 1700 modules via crossbar 1618. The crossbar 1618 is an interconnect network that couples many of the units of the parallel processing unit 1600 to other units of the parallel processing unit 1600. For example, the crossbar 1618 may be configured to couple the work distribution unit 1614 to a particular GPC 1700. Although not shown explicitly, one or more other units of the parallel processing unit 1600 may also be connected to the crossbar 1618 via the hub 1616.

The tasks are managed by the scheduler unit 1612 and dispatched to a GPC 1700 by the work distribution unit 1614. The GPC 1700 is configured to process the task and generate results. The results may be consumed by other tasks within the GPC 1700, routed to a different GPC 1700 via the crossbar 1618, or stored in the memory 1604. The results can be written to the memory 1604 via the memory partition unit 1800 modules, which implement a memory interface for reading and writing data to/from the memory 1604. The results can be transmitted to another parallel processing unit 1600 or CPU via the NVLink 1608. In an embodiment, the parallel processing unit 1600 includes a number U of memory partition unit 1800 modules that is equal to the number of separate and distinct memory 1604 devices coupled to the parallel processing unit 1600. A memory partition unit 1800 will be described in more detail below in conjunction with FIG. 18.

In an embodiment, a host processor executes a driver kernel that implements an application programming interface (API) that enables one or more applications executing on the host processor to schedule operations for execution on the parallel processing unit 1600. In an embodiment, multiple compute applications are simultaneously executed by the parallel processing unit 1600 and the parallel processing unit 1600 provides isolation, quality of service (QoS), and independent address spaces for the multiple compute applications. An application may generate instructions (e.g., API calls) that cause the driver kernel to generate one or more tasks for execution by the parallel processing unit 1600. The driver kernel outputs tasks to one or more streams being processed by the parallel processing unit 1600. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 19.

Figure 17:
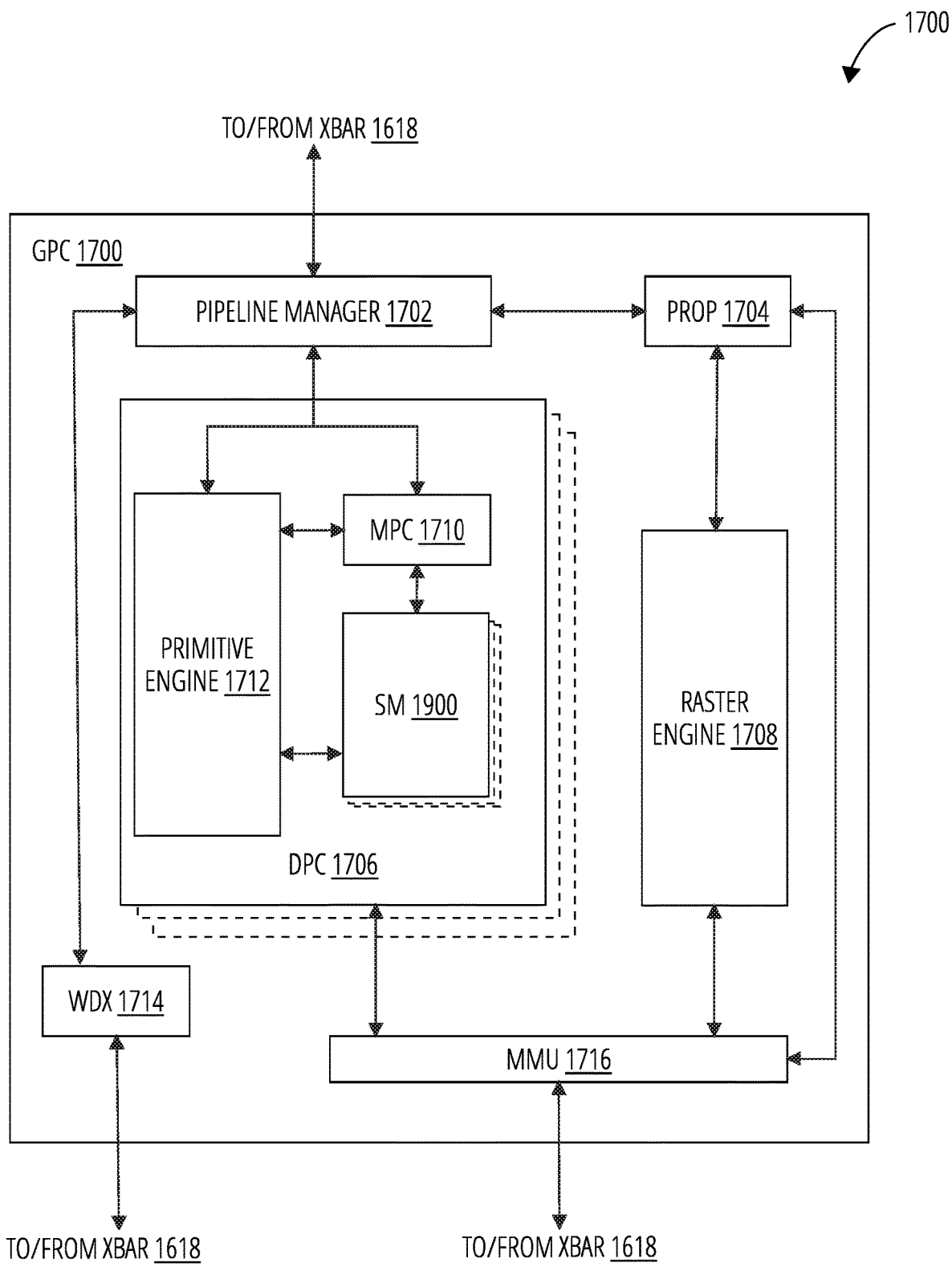
FIG. 17 illustrates a GPC 1700 in accordance with one embodiment.

FIG. 17 illustrates a GPC 1700 of the parallel processing unit 1600 of FIG. 16, in accordance with an embodiment. As shown in FIG. 17, each GPC 1700 includes a number of hardware units for processing tasks. In an embodiment, each GPC 1700 includes a pipeline manager 1702, a PROP 1704, a raster engine 1708, a WDX 1714, an MMU 1716, and one or more DPC 1706. It will be appreciated that the GPC 1700 of FIG. 17 may include other hardware units in lieu of or in addition to the units shown in FIG. 17.

In an embodiment, the operation of the GPC 1700 is controlled by the pipeline manager 1702. The pipeline manager 1702 manages the configuration of the one or more DPC 1706 modules for processing tasks allocated to the GPC 1700. In an embodiment, the pipeline manager 1702 may configure at least one of the one or more DPC 1706 modules to implement at least a portion of a graphics rendering pipeline. For example, a DPC 1706 may be configured to execute a vertex shader program on the programmable SM 1900. The pipeline manager 1702 may also be configured to route packets received from the work distribution unit 1614 to the appropriate logical units within the GPC 1700. For example, some packets may be routed to fixed function hardware units in the PROP 1704 and/or raster engine 1708 while other packets may be routed to the DPC 1706 modules for processing by the primitive engine 1712 or the SM 1900. In an embodiment, the pipeline manager 1702 may configure at least one of the one or more DPC 1706 modules to implement a neural network model and/or a computing pipeline.

Figure 18:
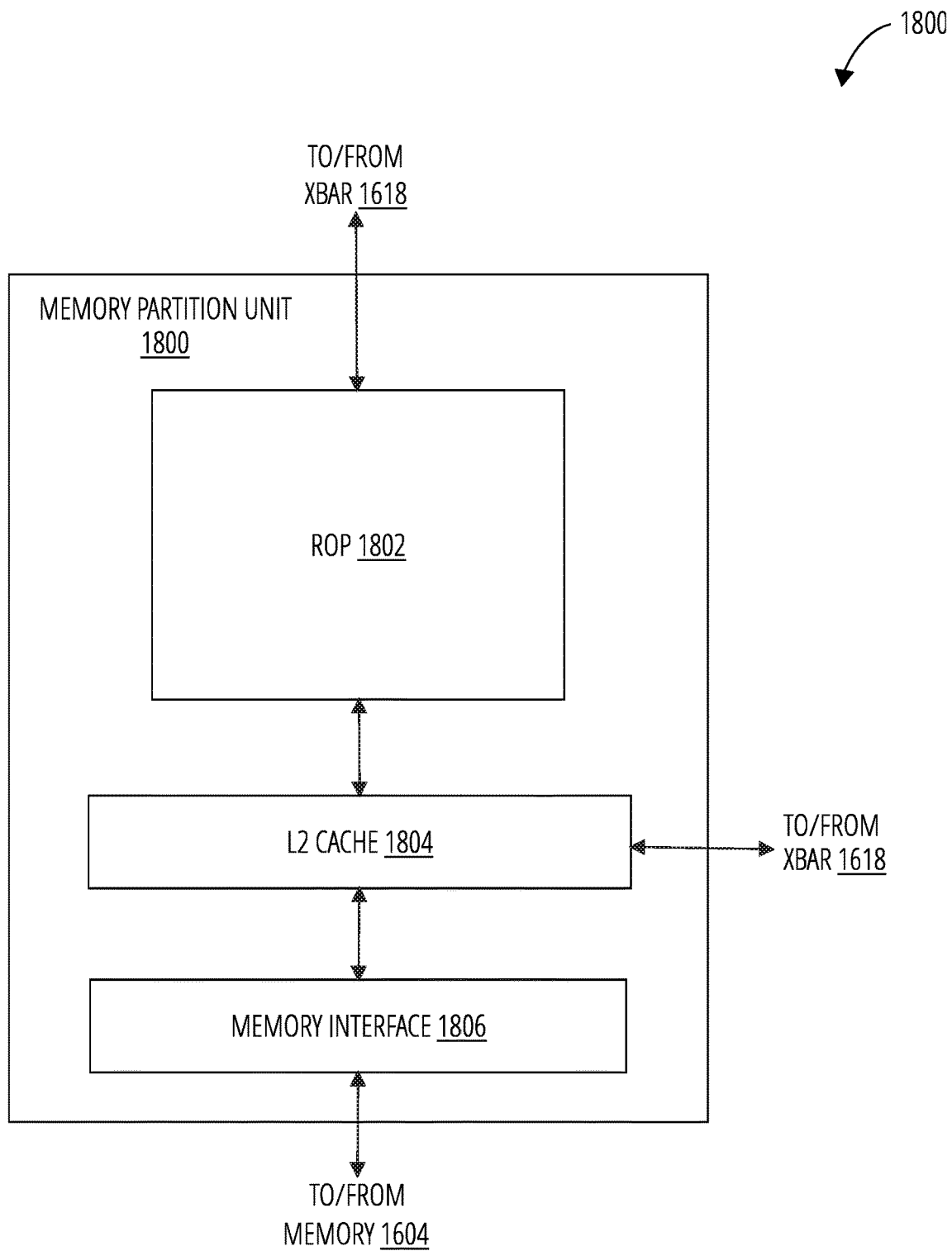
FIG. 18 illustrates a memory partition unit 1800 in accordance with one embodiment.

The PROP 1704 is configured to route data generated by the raster engine 1708 and the DPC 1706 modules to a Raster Operations (ROP) unit, described in more detail in conjunction with FIG. 18. The PROP 1704 may also be configured to perform optimizations for color blending, organize pixel data, perform address translations, and the like.

The raster engine 1708 includes a number of fixed function hardware units configured to perform various raster operations. In an embodiment, the raster engine 1708 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1708 comprises fragments to be processed, for example, by a fragment shader implemented within a DPC 1706.

Each DPC 1706 included in the GPC 1700 includes an MPC 1710, a primitive engine 1712, and one or more SM 1900 modules. The MPC 1710 controls the operation of the DPC 1706, routing packets received from the pipeline manager 1702 to the appropriate units in the DPC 1706. For example, packets associated with a vertex may be routed to the primitive engine 1712, which is configured to fetch vertex attributes associated with the vertex from the memory 1604. In contrast, packets associated with a shader program may be transmitted to the SM 1900.

The SM 1900 comprises a programmable streaming processor that is configured to process tasks represented by a number of threads. Each SM 1900 is multi-threaded and configured to execute a plurality of threads (e.g., 32 threads) from a particular group of threads concurrently. In an embodiment, the SM 1900 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the SM 1900 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 1900 will be described in more detail below in conjunction with FIG. 19.

The MMU 1716 provides an interface between the GPC 1700 and the memory partition unit 1800. The MMU 1716 may provide translation of virtual addresses into physical addresses, memory protection, and arbitration of memory requests. In an embodiment, the MMU 1716 provides one or more translation lookaside buffers (TLBs) for performing translation of virtual addresses into physical addresses in the memory 1604.

FIG. 18 illustrates a memory partition unit 1800 of the parallel processing unit 1600 of FIG. 16, in accordance with an embodiment. As shown in FIG. 18, the memory partition unit 1800 includes a ROP 1802, an L2 cache 1804, and a memory interface 1806. The memory interface 1806 is coupled to the memory 1604. Memory interface 1806 may implement 32, 64, 128, 1024-bit data buses, or the like, for high-speed data transfer. In an embodiment, the parallel processing unit 1600 incorporates U memory interface 1806 modules, one memory interface 1806 per pair of memory partition unit 1800 modules, where each pair of memory partition unit 1800 modules is connected to a corresponding memory 1604 device. For example, parallel processing unit 1600 may be connected to up to Y memory 1604 devices, such as high bandwidth memory stacks or graphics double-data-rate, version 5, synchronous dynamic random access memory, or other types of persistent storage.

In an embodiment, the memory interface 1806 implements an HBM2 memory interface and Y equals half U. In an embodiment, the HBM2 memory stacks are located on the same physical package as the parallel processing unit 1600, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1604 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 1600 modules process very large datasets and/or run applications for extended periods.

In an embodiment, the parallel processing unit 1600 implements a multi-level memory hierarchy. In an embodiment, the memory partition unit 1800 supports a unified memory to provide a single unified virtual address space for CPU and parallel processing unit 1600 memory, enabling data sharing between virtual memory systems. In an embodiment the frequency of accesses by a parallel processing unit 1600 to memory located on other processors is traced to ensure that memory pages are moved to the physical memory of the parallel processing unit 1600 that is accessing the pages more frequently. In an embodiment, the NVLink 1608 supports address translation services allowing the parallel processing unit 1600 to directly access a CPU's page tables and providing full access to CPU memory by the parallel processing unit 1600.

In an embodiment, copy engines transfer data between multiple parallel processing unit 1600 modules or between parallel processing unit 1600 modules and CPUs. The copy engines can generate page faults for addresses that are not mapped into the page tables. The memory partition unit 1800 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1604 or other system memory may be fetched by the memory partition unit 1800 and stored in the L2 cache 1804, which is located on-chip and is shared between the various GPC 1700 modules. As shown, each memory partition unit 1800 includes a portion of the L2 cache 1804 associated with a corresponding memory 1604 device. Lower level caches may then be implemented in various units within the GPC 1700 modules. For example, each of the SM 1900 modules may implement an L1 cache. The L1 cache is private memory that is dedicated to a particular SM 1900. Data from the L2 cache 1804 may be fetched and stored in each of the L1 caches for processing in the functional units of the SM 1900 modules. The L2 cache 1804 is coupled to the memory interface 1806 and the crossbar 1618.

The ROP 1802 performs graphics raster operations related to pixel color, such as color compression, pixel blending, and the like. The ROP 1802 also implements depth testing in conjunction with the raster engine 1708, receiving a depth for a sample location associated with a pixel fragment from the culling engine of the raster engine 1708. The depth is tested against a corresponding depth in a depth buffer for a sample location associated with the fragment. If the fragment passes the depth test for the sample location, then the ROP 1802 updates the depth buffer and transmits a result of the depth test to the raster engine 1708. It will be appreciated that the number of partition memory partition unit 1800 modules may be different than the number of GPC 1700 modules and, therefore, each ROP 1802 may be coupled to each of the GPC 1700 modules. The ROP 1802 tracks packets received from the different GPC 1700 modules and determines which GPC 1700 that a result generated by the ROP 1802 is routed to through the crossbar 1618. Although the ROP 1802 is included within the memory partition unit 1800 in FIG. 18, in other embodiment, the ROP 1802 may be outside of the memory partition unit 1800. For example, the ROP 1802 may reside in the GPC 1700 or another unit.

Figure 19:
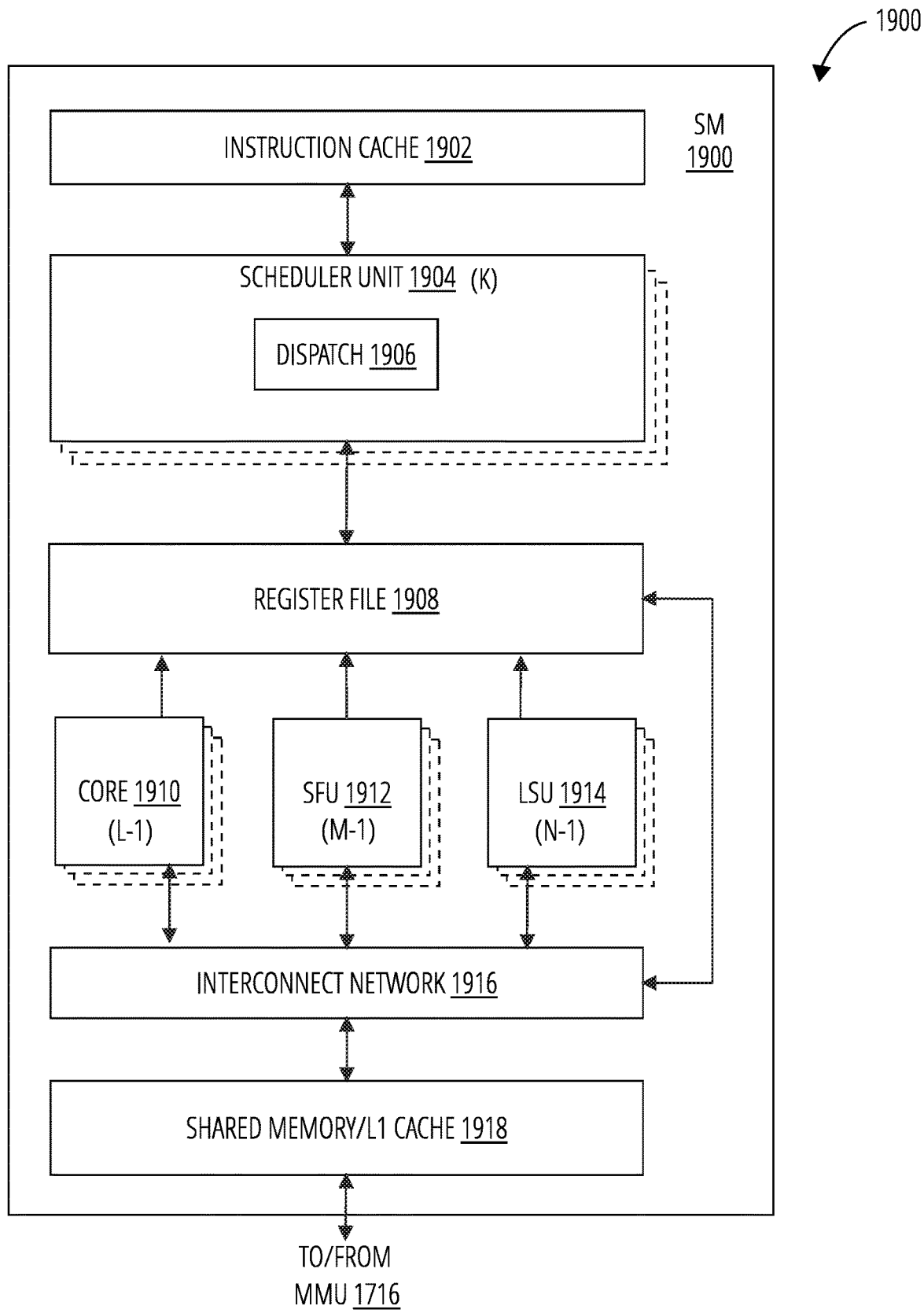
FIG. 19 illustrates an SM 1900 in accordance with one embodiment.

FIG. 19 illustrates the SM 1900 of FIG. 17, in accordance with an embodiment. As shown in FIG. 19, the SM 1900 includes an instruction cache 1902, one or more scheduler unit 1904 modules (e.g., such as scheduler unit 1612), a register file 1908, one or more processing core 1910 modules, one or more SFU 1912 modules, one or more LSU 1914 modules, an interconnect network 1916, and a shared memory/L1 cache 1918.

As described above, the work distribution unit 1614 dispatches tasks for execution on the GPC 1700 modules of the parallel processing unit 1600. The tasks are allocated to a particular DPC 1706 within a GPC 1700 and, if the task is associated with a shader program, the task may be allocated to an SM 1900. The scheduler unit 1612 receives the tasks from the work distribution unit 1614 and manages instruction scheduling for one or more thread blocks assigned to the SM 1900. The scheduler unit 1904 schedules thread blocks for execution as warps of parallel threads, where each thread block is allocated at least one warp. In an embodiment, each warp executes 32 threads. The scheduler unit 1904 may manage a plurality of different thread blocks, allocating the warps to the different thread blocks and then dispatching instructions from the plurality of different cooperative groups to the various functional units (e.g., core 1910 modules, SFU 1912 modules, and LSU 1914 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1906 unit is configured within the scheduler unit 1904 to transmit instructions to one or more of the functional units. In one embodiment, the scheduler unit 1904 includes two dispatch 1906 units that enable two different instructions from the same warp to be dispatched during each clock cycle. In alternative embodiments, each scheduler unit 1904 may include a single dispatch 1906 unit or additional dispatch 1906 units.

Each SM 1900 includes a register file 1908 that provides a set of registers for the functional units of the SM 1900. In an embodiment, the register file 1908 is divided between each of the functional units such that each functional unit is allocated a dedicated portion of the register file 1908. In another embodiment, the register file 1908 is divided between the different warps being executed by the SM 1900. The register file 1908 provides temporary storage for operands connected to the data paths of the functional units.

Each SM 1900 comprises L processing core 1910 modules. In an embodiment, the SM 1900 includes a large number (e.g., 128, etc.) of distinct processing core 1910 modules. Each core 1910 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1910 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1910 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 1900 also comprises M SFU 1912 modules that perform special functions (e.g., attribute evaluation, reciprocal square root, and the like). In an embodiment, the SFU 1912 modules may include a tree traversal unit configured to traverse a hierarchical tree data structure. In an embodiment, the SFU 1912 modules may include texture unit configured to perform texture map filtering operations. In an embodiment, the texture units are configured to load texture maps (e.g., a 2D array of texels) from the memory 1604 and sample the texture maps to produce sampled texture values for use in shader programs executed by the SM 1900. In an embodiment, the texture maps are stored in the shared memory/L1 cache 1918. The texture units implement texture operations such as filtering operations using mip-maps (e.g., texture maps of varying levels of detail). In an embodiment, each SM 1900 includes two texture units.

Each SM 1900 also comprises N LSU 1914 modules that implement load and store operations between the shared memory/L1 cache 1918 and the register file 1908. Each SM 1900 includes an interconnect network 1916 that connects each of the functional units to the register file 1908 and the LSU 1914 to the register file 1908 and shared memory/L1 cache 1918. In an embodiment, the interconnect network 1916 is a crossbar that can be configured to connect any of the functional units to any of the registers in the register file 1908 and connect the LSU 1914 modules to the register file 1908 and memory locations in shared memory/L1 cache 1918.

The shared memory/L1 cache 1918 is an array of on-chip memory that allows for data storage and communication between the SM 1900 and the primitive engine 1712 and between threads in the SM 1900. In an embodiment, the shared memory/L1 cache 1918 comprises 128 KB of storage capacity and is in the path from the SM 1900 to the memory partition unit 1800. The shared memory/L1 cache 1918 can be used to cache reads and writes. One or more of the shared memory/L1 cache 1918, L2 cache 1804, and memory 1604 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1918 enables the shared memory/L1 cache 1918 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 16, are bypassed, creating a much simpler programming model. In the general purpose parallel computation configuration, the work distribution unit 1614 assigns and distributes blocks of threads directly to the DPC 1706 modules. The threads in a block execute the same program, using a unique thread ID in the calculation to ensure each thread generates unique results, using the SM 1900 to execute the program and perform calculations, shared memory/L1 cache 1918 to communicate between threads, and the LSU 1914 to read and write global memory through the shared memory/L1 cache 1918 and the memory partition unit 1800. When configured for general purpose parallel computation, the SM 1900 can also write commands that the scheduler unit 1612 can use to launch new work on the DPC 1706 modules.

The parallel processing unit 1600 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 1600 is embodied on a single semiconductor substrate. In another embodiment, the parallel processing unit 1600 is included in a system-on-a-chip (SoC) along with one or more other devices such as additional parallel processing unit 1600 modules, the memory 1604, a reduced instruction set computer (RISC) CPU, a memory management unit (MMU), a digital-to-analog converter (DAC), and the like.

In an embodiment, the parallel processing unit 1600 may be included on a graphics card that includes one or more memory devices 304. The graphics card may be configured to interface with a PCIe slot on a motherboard of a desktop computer. In yet another embodiment, the parallel processing unit 1600 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 20:
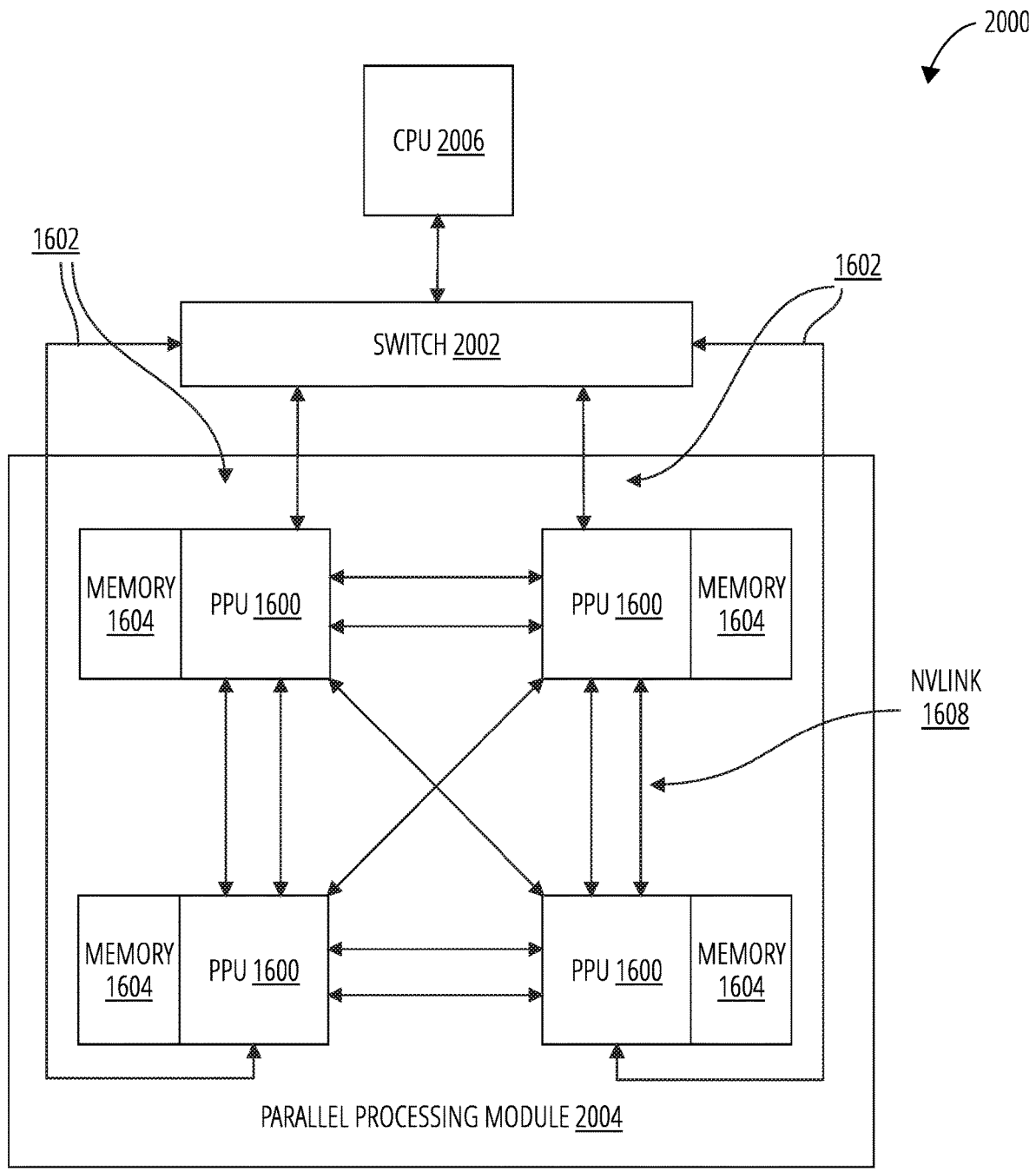
FIG. 20 illustrates a processing system 2000 in accordance with one embodiment.

FIG. 20 is a conceptual diagram of a processing system 2000 implemented using the parallel processing unit 1600 of FIG. 16, in accordance with an embodiment. The processing system 2000 includes a CPU 2006, switch 2002, and multiple parallel processing unit 1600 modules each and respective memory 1604 modules. The NVLink 1608 provides high-speed communication links between each of the parallel processing unit 1600 modules. Although a particular number of NVLink 1608 and interconnect 1602 connections are illustrated in FIG. 20, the number of connections to each parallel processing unit 1600 and the CPU 2006 may vary. The switch 2002 interfaces between the interconnect 1602 and the CPU 2006. The parallel processing unit 1600 modules, memory 1604 modules, and NVLink 1608 connections may be situated on a single semiconductor platform to form a parallel processing module 2004. In an embodiment, the switch 2002 supports two or more protocols to interface between various different connections and/or links.

In another embodiment (not shown), the NVLink 1608 provides one or more high-speed communication links between each of the parallel processing unit 1600 modules and the CPU 2006 and the switch 2002 interfaces between the interconnect 1602 and each of the parallel processing unit 1600 modules. The parallel processing unit 1600 modules, memory 1604 modules, and interconnect 1602 may be situated on a single semiconductor platform to form a parallel processing module 2004. In yet another embodiment (not shown), the interconnect 1602 provides one or more communication links between each of the parallel processing unit 1600 modules and the CPU 2006 and the switch 2002 interfaces between each of the parallel processing unit 1600 modules using the NVLink 1608 to provide one or more high-speed communication links between the parallel processing unit 1600 modules. In another embodiment (not shown), the NVLink 1608 provides one or more high-speed communication links between the parallel processing unit 1600 modules and the CPU 2006 through the switch 2002. In yet another embodiment (not shown), the interconnect 1602 provides one or more communication links between each of the parallel processing unit 1600 modules directly. One or more of the NVLink 1608 high-speed communication links may be implemented as a physical NVLink interconnect or either an on-chip or on-die interconnect using the same protocol as the NVLink 1608.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 2004 may be implemented as a circuit board substrate and each of the parallel processing unit 1600 modules and/or memory 1604 modules may be packaged devices. In an embodiment, the CPU 2006, switch 2002, and the parallel processing module 2004 are situated on a single semiconductor platform.

In an embodiment, the signaling rate of each NVLink 1608 is 20 to 25 Gigabits/second and each parallel processing unit 1600 includes six NVLink 1608 interfaces (as shown in FIG. 20, five NVLink 1608 interfaces are included for each parallel processing unit 1600). Each NVLink 1608 provides a data transfer rate of 25 Gigabytes/second in each direction, with six links providing 300 Gigabytes/second. The NVLink 1608 can be used exclusively for PPU-to-PPU communication as shown in FIG. 20, or some combination of PPU-to-PPU and PPU-to-CPU, when the CPU 2006 also includes one or more NVLink 1608 interfaces.

In an embodiment, the NVLink 1608 allows direct load/store/atomic access from the CPU 2006 to each parallel processing unit 1600 module's memory 1604. In an embodiment, the NVLink 1608 supports coherency operations, allowing data read from the memory 1604 modules to be stored in the cache hierarchy of the CPU 2006, reducing cache access latency for the CPU 2006. In an embodiment, the NVLink 1608 includes support for Address Translation Services (ATS), allowing the parallel processing unit 1600 to directly access page tables within the CPU 2006. One or more of the NVLink 1608 may also be configured to operate in a low-power mode.

Figure 21:
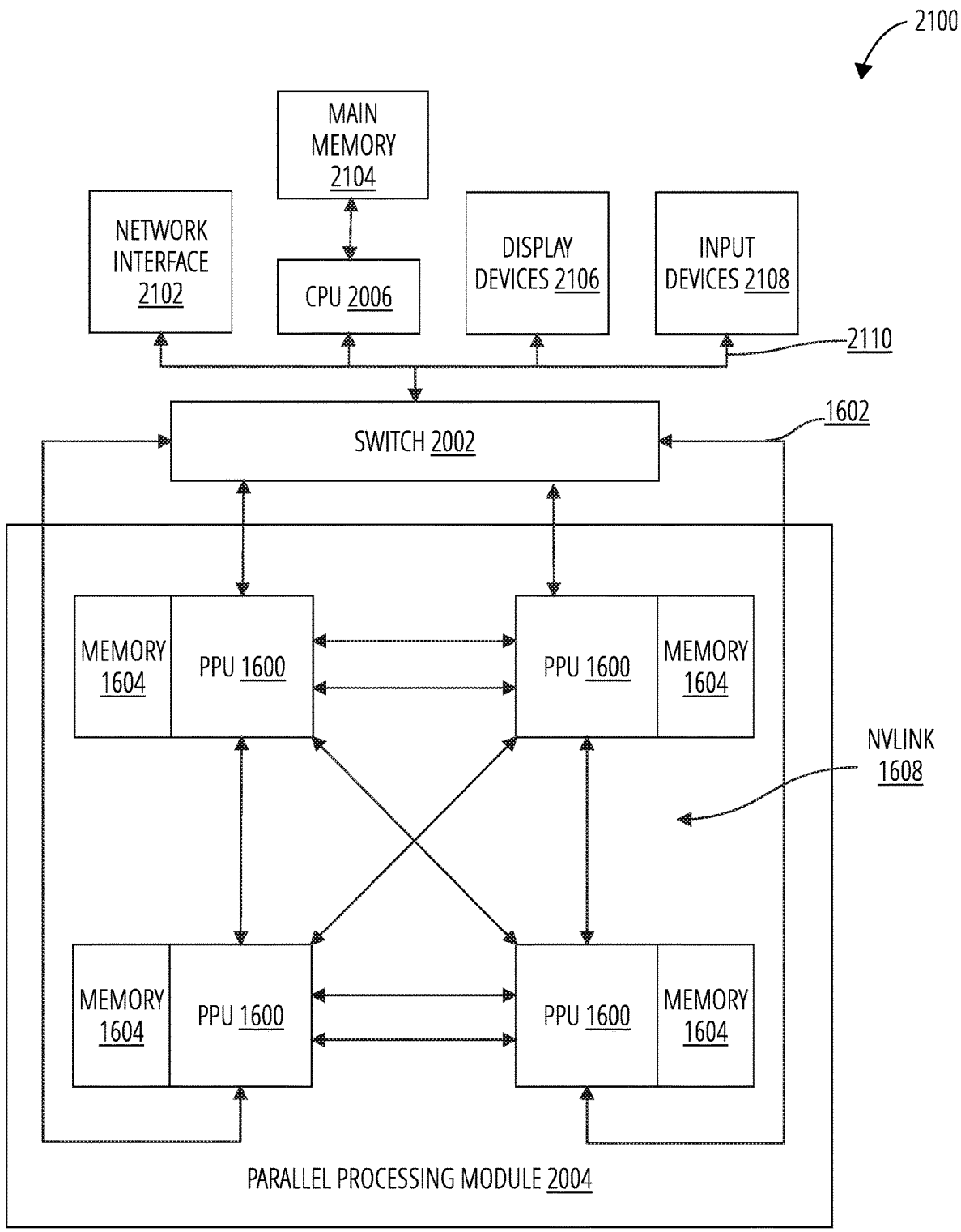
FIG. 21 illustrates an exemplary processing system 2100 in accordance with one embodiment.

FIG. 21 illustrates an exemplary processing system 2100 in which the various architecture and/or functionality of the various previous embodiments may be implemented. As shown, an exemplary processing system 2100 is provided including at least one CPU 2006 that is connected to a communication communications bus 2110. The communication communications bus 2110 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 2100 also includes a main memory 2104. Control logic (software) and data are stored in the main memory 2104 which may take the form of random access memory (RAM).

The exemplary processing system 2100 also includes input devices 2108, the parallel processing module 2004, and display devices 2106, e.g. a conventional CRT (cathode ray tube), LCD (liquid crystal display), LED (light emitting diode), plasma display or the like. User input may be received from the input devices 2108, e.g., keyboard, mouse, touchpad, microphone, and the like. Each of the foregoing modules and/or devices may even be situated on a single semiconductor platform to form the exemplary processing system 2100. Alternately, the various modules may also be situated separately or in various combinations of semiconductor platforms per the desires of the user.

Further, the exemplary processing system 2100 may be coupled to a network (e.g., a telecommunications network, local area network (LAN), wireless network, wide area network (WAN) such as the Internet, peer-to-peer network, cable network, or the like) through a network interface 2102 for communication purposes.

The exemplary processing system 2100 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 2104 and/or the secondary storage. Such computer programs, when executed, enable the exemplary processing system 2100 to perform various functions. The main memory 2104, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 2100 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

FIG. 21 is a conceptual diagram of a graphics processing pipeline 2200 implemented by the parallel processing unit 1600 of FIG. 16, in accordance with an embodiment. In an embodiment, the parallel processing unit 1600 comprises a graphics processing unit (GPU). The parallel processing unit 1600 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 1600 can be configured to process the graphics primitives to generate a frame buffer (e.g., pixel data for each of the pixels of the display).

An application writes model data for a scene (e.g., a collection of vertices and attributes) to a memory such as a system memory or memory 1604. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SM 1900 modules of the parallel processing unit 1600 including one or more of a vertex shader, hull shader, domain shader, geometry shader, and a pixel shader. For example, one or more of the SM 1900 modules may be configured to execute a vertex shader program that processes a number of vertices defined by the model data. In an embodiment, the different SM 1900 modules may be configured to execute different shader programs concurrently. For example, a first subset of SM 1900 modules may be configured to execute a vertex shader program while a second subset of SM 1900 modules may be configured to execute a pixel shader program. The first subset of SM 1900 modules processes vertex data to produce processed vertex data and writes the processed vertex data to the L2 cache 1804 and/or the memory 1604. After the processed vertex data is rasterized (e.g., transformed from three-dimensional data into two-dimensional data in screen space) to produce fragment data, the second subset of SM 1900 modules executes a pixel shader to produce processed fragment data, which is then blended with other processed fragment data and written to the frame buffer in memory 1604. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 2200 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 2200 receives input data 601 that is transmitted from one stage to the next stage of the graphics processing pipeline 2200 to generate output data 2204. In an embodiment, the graphics processing pipeline 2200 may represent a graphics processing pipeline defined by the OpenGL® API. As an option, the graphics processing pipeline 2200 may be implemented in the context of the functionality and architecture of the previous Figures and/or any subsequent Figure(s).

Figure 22:
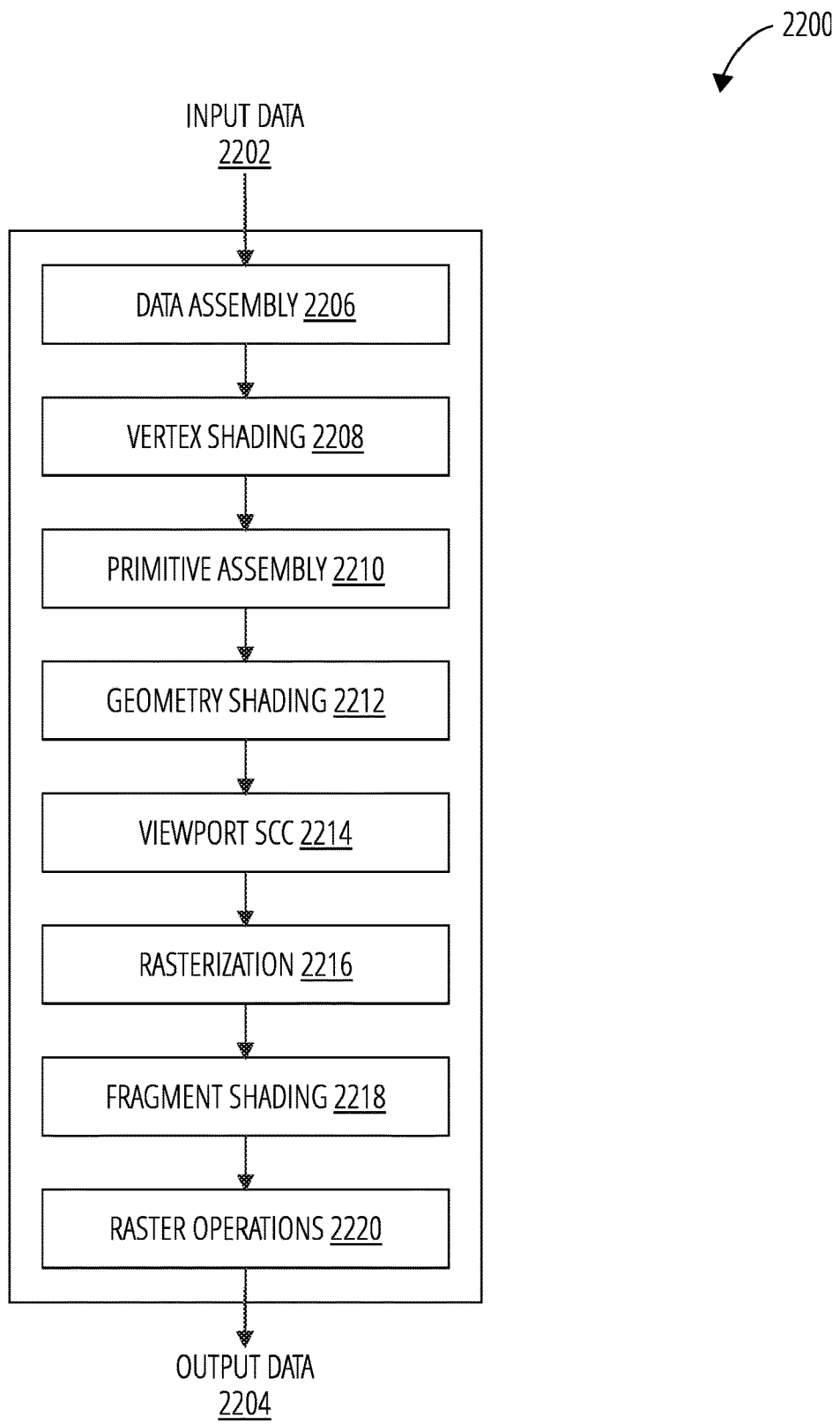
FIG. 22 illustrates a graphics processing pipeline 2200 in accordance with one embodiment.

As shown in FIG. 22, the graphics processing pipeline 2200 comprises a pipeline architecture that includes a number of stages. The stages include, but are not limited to, a data assembly 2206 stage, a vertex shading 2208 stage, a primitive assembly 2210 stage, a geometry shading 2212 stage, a viewport SCC 2214 stage, a rasterization 2216 stage, a fragment shading 2218 stage, and a raster operations 2220 stage. In an embodiment, the input data 2202 comprises commands that configure the processing units to implement the stages of the graphics processing pipeline 2200 and geometric primitives (e.g., points, lines, triangles, quads, triangle strips or fans, etc.) to be processed by the stages. The output data 2204 may comprise pixel data (e.g., color data) that is copied into a frame buffer or other type of surface data structure in a memory.

The data assembly 2206 stage receives the input data 2202 that specifies vertex data for high-order surfaces, primitives, or the like. The data assembly 2206 stage collects the vertex data in a temporary storage or queue, such as by receiving a command from the host processor that includes a pointer to a buffer in memory and reading the vertex data from the buffer. The vertex data is then transmitted to the vertex shading 2208 stage for processing.

The vertex shading 2208 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 2208 stage may manipulate individual vertex attributes such as position, color, texture coordinates, and the like. In other words, the vertex shading 2208 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 2208 stage generates transformed vertex data that is transmitted to the primitive assembly 2210 stage.

The primitive assembly 2210 stage collects vertices output by the vertex shading 2208 stage and groups the vertices into geometric primitives for processing by the geometry shading 2212 stage. For example, the primitive assembly 2210 stage may be configured to group every three consecutive vertices as a geometric primitive (e.g., a triangle) for transmission to the geometry shading 2212 stage. In some embodiments, specific vertices may be reused for consecutive geometric primitives (e.g., two consecutive triangles in a triangle strip may share two vertices). The primitive assembly 2210 stage transmits geometric primitives (e.g., a collection of associated vertices) to the geometry shading 2212 stage.

The geometry shading 2212 stage processes geometric primitives by performing a set of operations (e.g., a geometry shader or program) on the geometric primitives. Tessellation operations may generate one or more geometric primitives from each geometric primitive. In other words, the geometry shading 2212 stage may subdivide each geometric primitive into a finer mesh of two or more geometric primitives for processing by the rest of the graphics processing pipeline 2200. The geometry shading 2212 stage transmits geometric primitives to the viewport SCC 2214 stage.

In an embodiment, the graphics processing pipeline 2200 may operate within a streaming multiprocessor and the vertex shading 2208 stage, the primitive assembly 2210 stage, the geometry shading 2212 stage, the fragment shading 2218 stage, and/or hardware/software associated therewith, may sequentially perform processing operations. Once the sequential processing operations are complete, in an embodiment, the viewport SCC 2214 stage may utilize the data. In an embodiment, primitive data processed by one or more of the stages in the graphics processing pipeline 2200 may be written to a cache (e.g. L1 cache, a vertex cache, etc.). In this case, in an embodiment, the viewport SCC 2214 stage may access the data in the cache. In an embodiment, the viewport SCC 2214 stage and the rasterization 2216 stage are implemented as fixed function circuitry.

The viewport SCC 2214 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 2216 stage.

The rasterization 2216 stage converts the 3D geometric primitives into 2D fragments (e.g. capable of being utilized for display, etc.). The rasterization 2216 stage may be configured to utilize the vertices of the geometric primitives to setup a set of plane equations from which various attributes can be interpolated. The rasterization 2216 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 2216 stage generates fragment data (e.g., interpolated vertex attributes associated with a particular sample location for each covered pixel) that are transmitted to the fragment shading 2218 stage.

The fragment shading 2218 stage processes fragment data by performing a set of operations (e.g., a fragment shader or a program) on each of the fragments. The fragment shading 2218 stage may generate pixel data (e.g., color values) for the fragment such as by performing lighting operations or sampling texture maps using interpolated texture coordinates for the fragment. The fragment shading 2218 stage generates pixel data that is transmitted to the raster operations 2220 stage.

The raster operations 2220 stage may perform various operations on the pixel data such as performing alpha tests, stencil tests, and blending the pixel data with other pixel data corresponding to other fragments associated with the pixel. When the raster operations 2220 stage has finished processing the pixel data (e.g., the output data 2204), the pixel data may be written to a render target such as a frame buffer, a color buffer, or the like.

It will be appreciated that one or more additional stages may be included in the graphics processing pipeline 2200 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 2212 stage). Other types of graphics processing pipelines are contemplated as being within the scope of the present disclosure. Furthermore, any of the stages of the graphics processing pipeline 2200 may be implemented by one or more dedicated hardware units within a graphics processor such as parallel processing unit 1600. Other stages of the graphics processing pipeline 2200 may be implemented by programmable hardware units such as the SM 1900 of the parallel processing unit 1600.

The graphics processing pipeline 2200 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 1600. The API provides an abstraction for a programmer that lets a programmer utilize specialized graphics hardware, such as the parallel processing unit 1600, to generate the graphical data without requiring the programmer to utilize the specific instruction set for the parallel processing unit 1600. The application may include an API call that is routed to the device driver for the parallel processing unit 1600. The device driver interprets the API call and performs various operations to respond to the API call. In some instances, the device driver may perform operations by executing instructions on the CPU. In other instances, the device driver may perform operations, at least in part, by launching operations on the parallel processing unit 1600 utilizing an input/output interface between the CPU and the parallel processing unit 1600. In an embodiment, the device driver is configured to implement the graphics processing pipeline 2200 utilizing the hardware of the parallel processing unit 1600.

Various programs may be executed within the parallel processing unit 1600 in order to implement the various stages of the graphics processing pipeline 2200. For example, the device driver may launch a kernel on the parallel processing unit 1600 to perform the vertex shading 2208 stage on one SM 1900 (or multiple SM 1900 modules). The device driver (or the initial kernel executed by the parallel processing unit 1600) may also launch other kernels on the parallel processing unit 1600 to perform other stages of the graphics processing pipeline 2200, such as the geometry shading 2212 stage and the fragment shading 2218 stage. In addition, some of the stages of the graphics processing pipeline 2200 may be implemented on fixed unit hardware such as a rasterizer or a data assembler implemented within the parallel processing unit 1600. It will be appreciated that results from one kernel may be processed by one or more intervening fixed function hardware units before being processed by a subsequent kernel on an SM 1900.

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

"Logic" is used herein to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed.

What is claimed is:

1. A signal transceiver comprising:
    a signal transmitter comprising:
        a first differential link configured with a first common mode voltage, the first differential link coupled to a first switch between a supply voltage of the signal transmitter and a fraction of the supply voltage; and
        a second differential link configured with a second common mode voltage, the second differential link configured to a second switch between the fraction of the supply voltage and a reference ground;
    a signal receiver comprising:
        the first differential link coupled to a gate node of an NMOS transistor and to a source node of a PMOS transistor; and
        the second differential link coupled to a source node of the NMOS transistor and to a gate node of the PMOS transistor.

2. The signal transceiver of claim 1, the signal receiver further comprising an active inductive circuit to pull a voltage on the first differential link toward the supply voltage.

3. The signal transceiver of claim 1, the signal receiver further comprising an active inductive circuit to pull a voltage on the second differential link toward the reference ground.

4. The signal transceiver of claim 1, the signal receiver further comprising an active inductive circuit as a load.

5. The signal transceiver of claim 1, further comprising an AC-coupled voltage level-shifting circuit.

6. The signal transceiver of claim 5, the voltage level-shifting circuit comprising a first inverter with resistive element feedback on the first differential link and a second inverter with resistive element feedback on the second differential link.

7. The signal transceiver of claim 1, the signal receiver further comprising a voltage level-shifting circuit comprising at least one NMOS transistor driven by the first differential link and at least one PMOS transistor driven by the second differential link.

8. The signal transceiver of claim 1, the signal receiver further comprising a voltage level-shifting circuit comprising at least one PMOS transistor driven by the first differential link and at least one NMOS transistor driven by the second differential link.

9. The signal transceiver of claim 1, the signal receiver further comprising a peaking circuit comprising a plurality of cross-coupled inverters each comprising resistive and capacitive feedback.

10. The signal transceiver of claim 1, the signal receiver further comprising a slicing circuit comprising a sense amplifier.

11. A signal receiver comprising:
    a first differential link configured with a first common mode voltage
    a second differential link configured with a second common mode voltage; and
    the first differential link and the second differential link cross-coupled between a gate node of an NMOS transistor and to a gate node of a PMOS transistor.

12. The signal transceiver of claim 11, the first differential link coupled to the gate node of the NMOS transistor and a source node of the PMOS transistor.

13. The signal receiver of claim 11, the second differential link coupled to the gate node of the PMOS transistor and a source node of the NMOS transistor.

14. The signal receiver of claim 11, further comprising a first output differential link coupled to a drain node of the NMOS transistor and a second output differential link coupled to a drain node of the PMOS transistor.

15. The signal receiver of claim 14, further comprising an active inductive circuit coupled between the first output differential link and the second output differential link.

16. The signal receiver of claim 14, further comprising a voltage level-shifting circuit coupled between the first output differential link and the second output differential link.

17. The signal receiver of claim 16, the voltage level-shifting circuit further coupled to the first differential link and the second differential link.

18. A signal transceiver comprising:
a signal transmitter comprising:
  a first differential link configured with a first common mode voltage, the first differential link operable at voltage levels between a supply voltage of the signal transmitter and one half of the supply voltage; and
  a second differential link configured with a second common mode voltage, the second differential link operable between one half of the supply voltage and reference ground;
a signal receiver configured to extract a bit value communicated as a difference between a first voltage level on the first differential link and a second voltage level on the second differential link.

19. The signal transceiver of claim 18, the signal receiver further comprising a voltage level-shifting circuit followed by a peaking circuit.

20. The signal transceiver of claim 18, the signal receiver utilizing a sense amplifier as a slicing circuit for the bit value.

* * * * *